United States Patent
Baek et al.

(10) Patent No.: US 12,213,348 B2
(45) Date of Patent: Jan. 28, 2025

(54) DISPLAY DEVICE

(71) Applicant: SAMSUNG DISPLAY CO., LTD., Yongin-si (KR)

(72) Inventors: Gyung Min Baek, Yongin-si (KR); Ju Hyun Lee, Seongnam-si (KR); Tae Wook Kang, Seongnam-si (KR); Hyun Eok Shin, Gwacheon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/443,131

(22) Filed: Feb. 15, 2024

(65) Prior Publication Data

US 2024/0260336 A1    Aug. 1, 2024

Related U.S. Application Data

(62) Division of application No. 17/445,977, filed on Aug. 26, 2021, now Pat. No. 11,910,659.

(30) Foreign Application Priority Data

Sep. 15, 2020    (KR) .................. 10-2020-0118293

(51) Int. Cl.
*H10K 59/12*    (2023.01)
*H10K 50/86*    (2023.01)
(Continued)

(52) U.S. Cl.
CPC ......... *H10K 59/123* (2023.02); *H10K 50/865* (2023.02); *H10K 59/1213* (2023.02); *H10K 59/1216* (2023.02); *H01L 27/1255* (2013.01)

(58) Field of Classification Search
CPC ............ H10K 59/1213; H10K 59/123; H10K 59/1216; H10K 50/865
(Continued)

(56) References Cited

U.S. PATENT DOCUMENTS 9,543,367 B2    1/2017  Park et al.
9,928,777 B2    3/2018  Kim et al.
(Continued)

FOREIGN PATENT DOCUMENTS

CN    110098223 A  *  8/2019   ........... G06F 3/0412
CN    210606576 U     5/2020
(Continued)

OTHER PUBLICATIONS

Korean Office Action for KR Application No. 10-2020-0118293, dated Nov. 28, 2024, 7 pages.

*Primary Examiner* — Phuc T Dang
(74) *Attorney, Agent, or Firm* — Lewis Roca Rothgerber Christie LLP

(57) ABSTRACT

A display device is provided. A display device includes a non-display area where no image is displayed, and a display area where images are displayed, and including a first area and a second area having different light transmittances, and a first pixel and a second pixel, wherein a transistor and an anode electrode of the first pixel are in the first area, wherein an anode electrode of the second pixel is in the second area, and a transistor of the second pixel is outside the second area, wherein the anode electrode and the transistor of the second pixel are electrically connected by a connection line, and wherein at least a part of the connection line is in at least one of the first area and the second area, and is covered by an anti-reflection layer.

6 Claims, 20 Drawing Sheets

(51) Int. Cl.
*H10K 59/121* (2023.01)
*H10K 59/123* (2023.01)
*H01L 27/12* (2006.01)

(58) Field of Classification Search
USPC .......................................................... 257/72
See application file for complete search history.

(56) References Cited

U.S. PATENT DOCUMENTS

| | | |
|---|---|---|
| 11,417,717 B2 | 8/2022 | Lee et al. |
| 12,022,703 B2 | 6/2024 | Lee et al. |
| 2016/0204169 A1* | 7/2016 | Oh ....................... H10K 59/121 |
| | | 257/40 |
| 2021/0003896 A1 | 1/2021 | Yoshida et al. |
| 2021/0336232 A1 | 10/2021 | Baek et al. |
| 2024/0315099 A1 | 9/2024 | Lee et al. |

FOREIGN PATENT DOCUMENTS

| | | | |
|---|---|---|---|
| EP | 3629376 A1 | 4/2020 | |
| KR | 10-2016-0005230 A | 1/2016 | |
| KR | 10-2017-0113066 A | 10/2017 | |
| KR | 10-2018-0004384 A | 1/2018 | |
| KR | 10-2020-0072928 A | 6/2020 | |
| KR | 20200097371 A * | 8/2020 | ......... H10K 59/1213 |
| KR | 2021-0132777 A | 11/2021 | |

\* cited by examiner

DPA: DPA_D, DPA_T

TR: TR1, TR2

130: 131, 132
150: 151, 152, 153
160: 161, 162, 163

162T: DC1, DC2, DC3

160: DP

DISPLAY DEVICE

CROSS-REFERENCE TO RELATED APPLICATIONS

This application is a divisional of U.S. patent application Ser. No. 17/445,977, filed Aug. 26, 2021 patent Ser. No. 11,910,659, which claims priority to and the benefit of Korean Patent Application No. 10-2020-0118293, filed Sep. 15, 2020, the entire content of both of which is incorporated herein by reference.

BACKGROUND

1. Field

The present disclosure relates to a display device.

2. Description of the Related Art

Electronic devices that provide images to a user, such as a smart phone, a tablet PC, a digital camera, a laptop computer, a navigation device, and a smart TV, include a display device for displaying images.

A display device may include a variety of optical devices, such as an image sensor for capturing an image on the front side, a proximity sensor for detecting whether a user is located close to the front side of the display device, an illuminance sensor for detecting the illuminance of the front side of the display device, and an iris sensor for recognizing a user's iris.

As display devices are employed by various electronic devices, display devices are required to have various designs. For example, a display device for a smartphone is required to have a wider display area by way of eliminating a hole formed at the front face of the display device. If the hole is eliminated from the front face of the display device, an optical device, which is otherwise located in the hole, may be located such that it overlaps the display panel.

SUMMARY

Aspects of the present disclosure provide a display device capable of suppressing or prevent failures caused by lines located an area where images are displayed and light transmits as well, while making the lines less visible.

It should be noted that aspects of the present disclosure are not limited to the above-mentioned aspects; and other aspects of the present disclosure will be apparent to those skilled in the art from the following descriptions.

Some embodiments of a display device include a non-display area where no image is displayed, and a display area where images are displayed, and including a first area and a second area having different light transmittances, and a first pixel and a second pixel, wherein a transistor and an anode electrode of the first pixel are in the first area, wherein an anode electrode of the second pixel is in the second area, and a transistor of the second pixel is outside the second area, wherein the anode electrode and the transistor of the second pixel are electrically connected by a connection line, and wherein at least a part of the connection line is in at least one of the first area and the second area, and is covered by an anti-reflection layer.

The second area may include a transmitting area for transmitting light, and has a transmittance that is greater than that of the first area.

The transistor of the second pixel may be in at least one the non-display area and the first area.

The display device may further include a first insulating layer between the anode electrode of the second pixel and the connection line, wherein at least a part of the first insulating layer is in a region where the anode electrode of the second pixel and the connection line face each other, and wherein the anode electrode of the second pixel and the connection line are electrically connected via a through hole that penetrates the first insulating layer and the anti-reflection layer.

The through hole may be formed in the second area.

The display device may further include a first conductive layer including a source electrode and a drain electrode of the transistor of the second pixel, wherein a stack structure of the first conductive layer is substantially identical to a stack structure of the connection line.

The display device may further include a second insulating layer between the first conductive layer and the connection line.

The first conductive layer and the connection line have a stack structure of titanium (Ti)/aluminum (Al)/titanium (Ti).

The connection line may be on the same layer as the source electrode and the drain electrode of the transistor of the second pixel, the connection line and the source electrode and the drain electrode of the transistor of the second pixel forming the first conductive layer.

The connection line may include an opaque metal.

The anti-reflection layer may be formed in a substantially same pattern as the connection line in a plan view.

The anti-reflection layer may include molybdenum (Mo), a molybdenum alloy, a molybdenum oxide (MoOx), or an oxide of a molybdenum alloy.

The anti-reflection layer may have an electrical resistance that is greater than that of the connection line.

A width of the connection line may be between about 1.2 μm and about 1.5 μm.

Some embodiments of a display device include a non-display area where no image is displayed, and a display area where images are displayed and including a transmitting area, the display device including a pixel including a transistor in the non-display area, and an anode electrode in the display area, wherein the transistor and the anode electrode are electrically connected by a connection line having a same stack structure as a first conductive layer including a source electrode and a drain electrode of the transistor, and wherein at least a part of the connection line is in the display area and is covered by an anti-reflection layer.

The display device may further include an insulating layer between the anode electrode and the connection line, the anode electrode and connection line, wherein the anode electrode and the connection line are electrically connected via a through hole penetrating the insulating layer and the anti-reflection layer.

The through hole may be formed in the display area.

The connection line may include an opaque metal, and wherein a width of the connection line is between about 1.2 μm to about 1.5 μm.

The anti-reflection layer may have an electrical resistance that is greater than that of the connection line.

The anti-reflection layer may include molybdenum (Mo), a molybdenum alloy, a molybdenum oxide (MoOx), or an oxide of a molybdenum alloy.

According to some embodiments of the present disclosure, it is possible to suppress or prevent failures caused by lines located an area of a display device where images are displayed and light transmits as well, while making the lines less visible.

It should be noted that aspects of the present disclosure are not limited to those described above and other aspects of the present disclosure will be apparent to those skilled in the art from the following descriptions.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
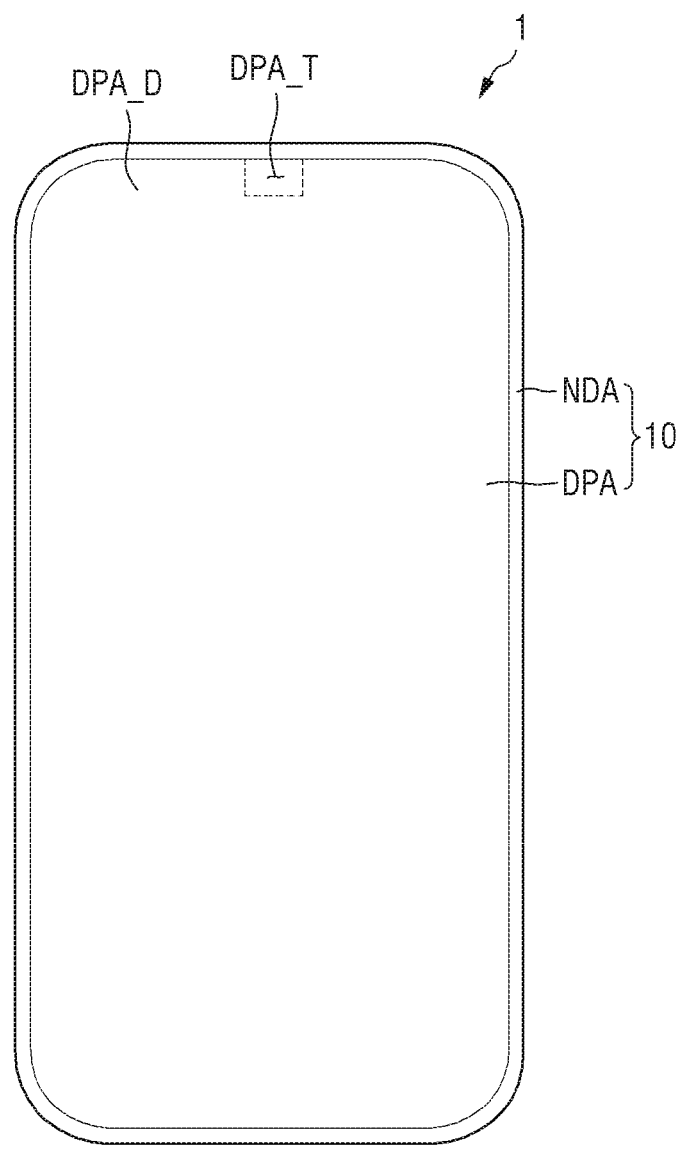
FIG. 1 is a plan view of a display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described with reference to the accompanying drawings.

Figure 2:
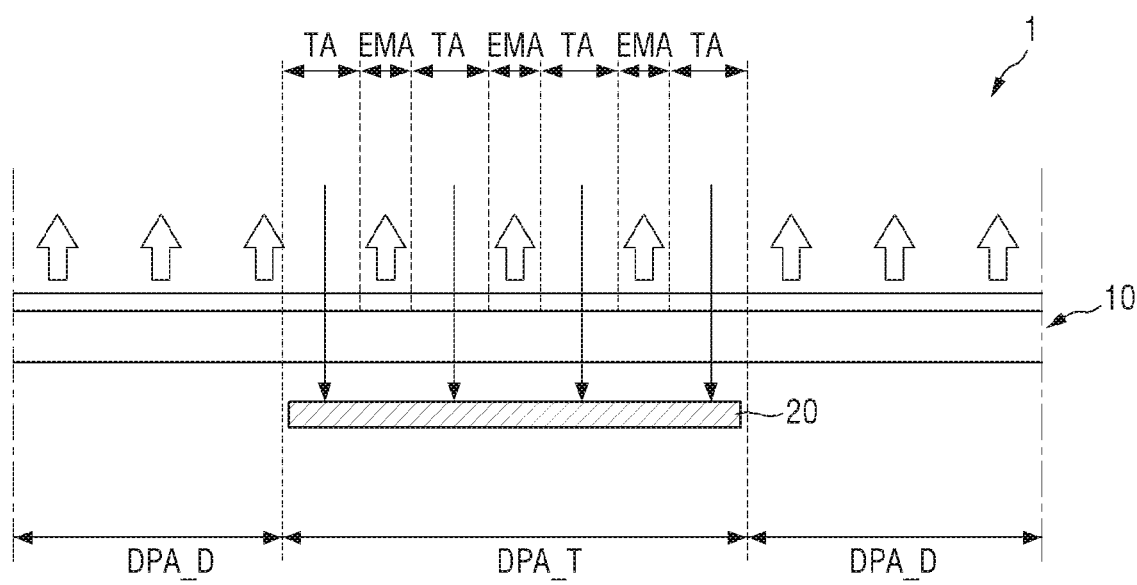
FIG. 2 is a cross-sectional view of a part of a display device according to some embodiments of the present disclosure.

FIG. 1 is a plan view of a display device according to some embodiments of the present disclosure. FIG. 2 is a cross-sectional view of a part of a display device according to some embodiments of the present disclosure.

Referring to FIGS. 1 and 2, the display device 1 is an electronic device including a display area DPA that displays images or videos. Any display device including a display area for displaying images or videos may be employed as the display device 1 regardless of its main purpose, added features, name, etc. Examples of the display device 1 include, but are not limited to, a smart phone, a mobile phone, a tablet PC, a personal digital assistant (PDA), a portable multimedia player (PMP), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various inspection devices, various home appliances including a distance such as a refrigerator and a laundry machine, Internet of things (IoT) devices, etc.

The display device 1 may include a display panel 10. Examples of the display panel 10 may include a self-luminous display panel, such as an organic light-emitting display panel (OLED), an inorganic light-emitting display panel (inorganic EL), a quantum-dot light-emitting display panel (QED), a micro LED display panel (micro-LED), a nano LED display panel (nano-LED), a plasma display panel (PDP), a field emission display panel (FED), and a cathode ray display panel (CRT), as well as a light-receiving display panel such as a liquid-crystal display panel (LCD) and an electrophoretic display panel (EPD).

In the following description, the organic light-emitting display panel will be described as an example of the display panel 10, and the organic light-emitting display panel will be simply referred to as the display panel 10 unless specifically stated otherwise. It is, however, to be understood that the embodiments of the present disclosure are not limited to the organic light-emitting display panel, and any other display panel listed above or well known in the art may be employed without departing from the scope of the present disclosure.

In addition to the display panel 10, the display device 1 may further include various controllers, a housing, sensors, and other elements.

As shown in FIG. 1, the display device 1 may include a display area DPA and a non-display area NDA. In the display area DPA, images are displayed. In the non-display area NDA, no image is displayed.

Figure 3:
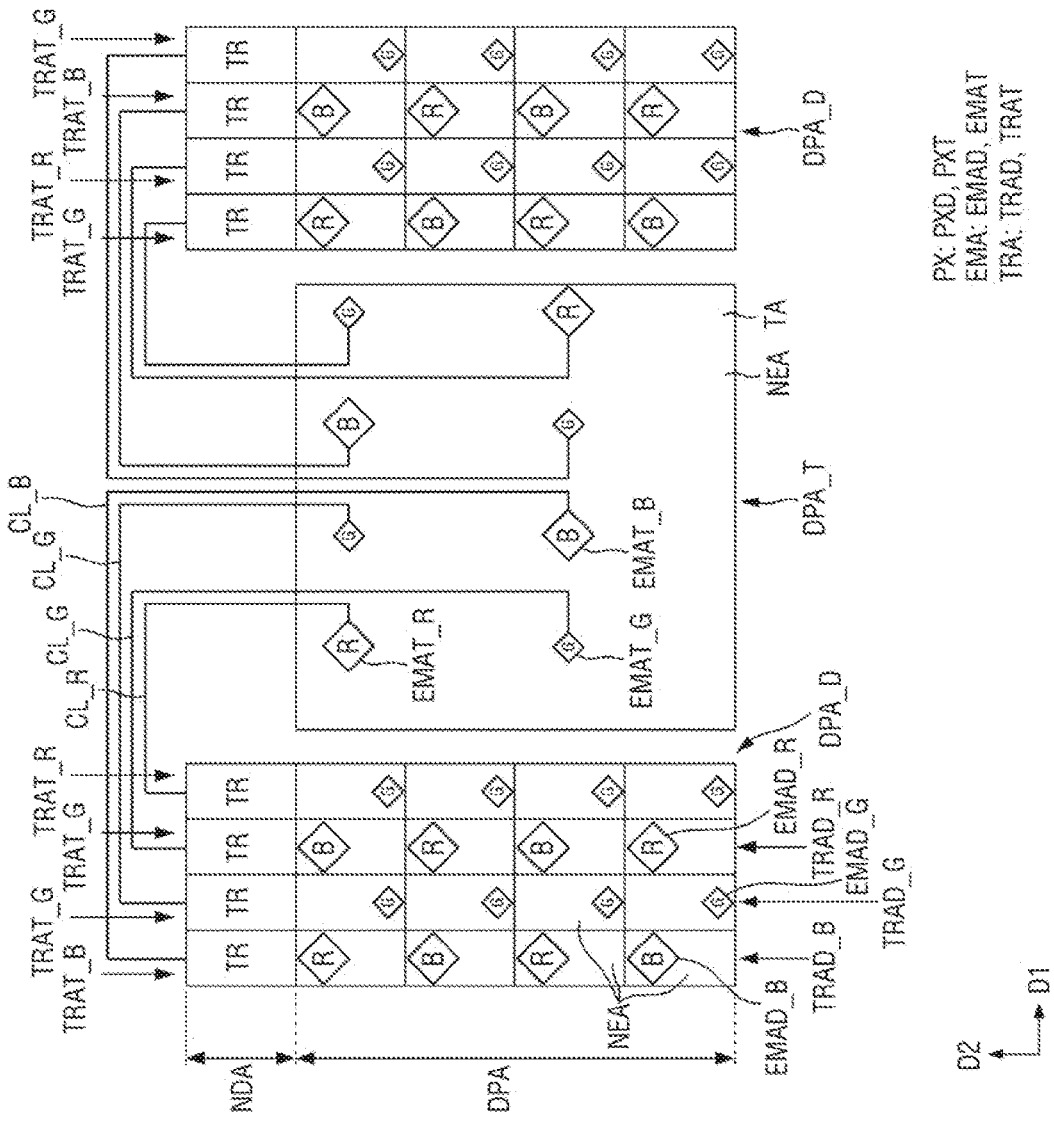
FIG. 3 is a diagram showing pixels arranged in different areas of the display panel, layouts of transistor areas and emission areas of the pixels, and transmitting areas, according to some embodiments.

The display area DPA includes a plurality of pixels PX (see FIG. 3). Each pixel PX is a unit for displaying an image (see FIG. 3). The pixels PX may include, but are not limited to, red pixels PXD_R and PXT_R (see FIG. 3), green pixels PXD_G, and PXT_G (see FIG. 3), and blue pixels PXD_B and PXT_B (see FIG. 3). The pixels PX may be alternately arranged when viewed from the top. For example, the pixels PX may be arranged in a matrix (see FIG. 3), although the present disclosure is not limited thereto. The pixels PX will be described in detail later.

The non-display area NDA may be located around the display area DPA. The non-display area NDA may be located around the display area DPA to surround it. In some embodiments, the display area DPA may be formed in a rectangular shape, and the non-display area NDA may be located along the four sides of the display area DPA. It is, however, to be understood that the present disclosure is not limited thereto. A black matrix may be located in the non-display area NDA to reduce or prevent leakage of light emitted from the adjacent pixels PX.

The display area DPA may include a first display area and a second display area having different transmittances. The display area DPA may be divided into the first display area and the second display area depending on whether a transmitting area TA is included or not. For example, the display area DPA may include a display-only area DPA_D as the first display area and a transmissive display area DPA_T as the second display area. The display area DPA may include one transmissive display area DPA_T, or may include a plurality of transmissive display areas DPA_T separated from one another. The display-only area DPA_D may be located around the transmissive display area DPA_T. The display-only area DPA_D may partially or entirely surround the transmissive display area DPA_T. The display-only area DPA_D and the transmissive display area DPA_T may be contiguous to each other, and may extend continuously without being physically separated. According to some embodiments, the display-only area DPA_D and the transmissive display area DPA_T cannot be distinguished by the naked eye, but the present disclosure is not limited thereto.

The arrangement of the transmissive display area DPA_T in the display area DPA is not limited herein. For example, the transmissive display area DPA_T may be located around an edge of the display area DPA and may be in contact with the non-display area NDA. Alternatively, the transmissive display area DPA_T may be spaced apart from the non-display area NDA and may be located to be surrounded by the display area DPA.

The display-only area DPA_D and the transmissive display area DPA_T include a plurality of pixels PX including the emission areas EMA. Images are displayed as light is emitted from the emission areas EMA of the pixels PX. The transmissive display area DPA_T further includes a plurality of transmitting areas TA in addition to the pixels PX including the emission areas EMA (see FIG. 3). The display-only area DPA_D includes no transmitting area TA.

The transmitting areas TA of the transmissive display area DPA_T do not emit light and transmit light in the thickness direction. The light may include not only light in the visible wavelength range, but also light in the near infrared and/or infrared wavelength range. The light transmitted by the transmitting area TA may further include light in the near-ultraviolet and/or ultraviolet wavelength ranges.

Non-emission areas NEA (see FIG. 3) of the display-only area DPA_D and the transmissive display area DPA_T do not emit light, either, but the transmitting areas TA have a higher transmittance than the non-emission areas NEA. Herein, transmittance refers to the transmittance of light passing through an area in the thickness direction. Accordingly, the transmissive display area DPA_T including the transmitting areas TA has a higher transmittance than the display-only area DPA_D. The transmissive display area DPA_T may be utilized for a variety of applications. As an application, the transmissive display area DPA_T may be utilized as a transparent display. In such an application, no other element is located on the rear side of the transmissive display area DPA_T, so that a viewer may see an object located on the rear side through the transmissive display area DPA_T, like a window.

Another use of the light transmission through the transmissive display area DPA_T is to use the transmissive display area DPA_T as a path for sensing light. For example, as shown in FIG. 2, the display device 1 may include a light sensing member 20 located under the transmissive display area DPA_T of the display panel 10. The light sensing member 20 may be a device that receives light to acquire information or exhibits particular features. Examples of the light sensing member 20 may include a camera including a photoelectric conversion element, an infrared proximity sensor, an iris recognition sensor, a fingerprint sensor, etc. The amount of light required for the light sensing member 20 varies depending on its type. By adjusting the aperture ratio of the transmissive display area DPA_T (a ratio of the transmitting areas TA to the entire area) and the transmittance of the transmitting areas TA, it is possible to prevent transfer a suitable amount of light. For example, by adjusting the ratio of the transmitting areas TA to the entire area of the transmissive display area DPA_T, or by adjusting the stack structure in the thickness direction, or by adjusting the material to control the transmittance of the light passing through the transmitting area TA, the light transmittance per unit area of the entire transmissive display area DPA_T and the total light transmittance (e.g., average light transmittance multiplied by area) may be appropriately determined.

In some embodiments, the display device 1 may include a plurality of different light sensing members 20. In this instance, the transmittance of the transmissive display area DPA_T corresponding to each of the light sensing members 20 may be adjusted differently depending on the maximum amount of light that is suitable for the light sensing member 20. By adjusting the size or arrangement of the pixels PX and the transmitting areas TA of each transmissive display area DPA_T, the transmittance of each transmissive display area DPA_T may be differently adjusted. In other embodiments, the transmittance of the transmissive display area DPA_T associated with each of the light sensing members 20 may be equally adjusted depending on a suitable degree of transmittance of the light sensing member that uses the maximum amount of light.

In a light-emitting mode in which the display device 1 displays images, the pixels PX around the transmitting areas TA also emit light, and thus the areas may be recognized as display areas DPA, and not as the transmitting areas TA. On the other hand, in a non-light-emitting mode in which the display device 1 does not display an image, the pixels PX around the transmitting areas TA do not emit light, and thus external light may be reflected by the light sensing members 20 and may be recognized. If the light sensing members 20 are seen inside the display area DPA, aesthetic effects may deteriorate. To prevent deterioration of the aesthetic effects, the surface of the light sensing members 20 may be subjected to treatment, such as matte treatment, black coating, and anti-reflection coating.

Because the transmissive display area DPA_T further includes the transmitting areas TA, as compared to the display-only area DPA_D, the density of the pixels PX may be different, which relates to the resolution. For example, the resolution of the transmissive display area DPA_T may be lower than that of the display-only area DPA_D, but the present disclosure is not limited thereto.

FIG. 3 is a diagram showing pixels arranged in different areas of the display panel, layouts of transistor areas and emission areas of the pixels, and transmitting areas, according to some embodiments.

Referring to FIG. 3, the display panel 10 according to some embodiments of the present disclosure may include a plurality of pixels PX. The pixels PX may include display-only area pixels PXD and transmissive display area pixels PXT depending on where emissive areas EMA are located. Emissive areas EMAD of the display-only area pixels PXD may be located in the display-only area DPA_D, while emissive areas EMAT of the transmissive display area pixels PXT may be located in the transmissive display area DPA_T.

The display-only area pixels PXD: PXD_R, PXD_G, and PXD_B and the transmissive display area pixels PXT: PXT_R, PXT_G, and PXT_B may include first pixels, second pixels, and third pixels for emitting lights of different colors. Although the present disclosure is not limited thereto, for example, the first pixels may emit red light, the second pixels may emit green light, and the third pixels may emit blue light. The transmissive display area DPA_T may further include transmitting areas TA in addition to the pixels PX. In the following description, the first pixels are referred to as red pixels PX_R: PXD_R and PXT_R, the second pixels are referred to as green pixels PX_G: PXD_G, and PXT_G, and the third pixels are referred to as blue pixels PX_B: PXD_B and PXT_B. It is, however, to be noted that the colors of lights emitted from the first, second and third pixels are not limited thereto.

The display-only area pixels PXD and the transmissive display area pixels PXT may include emission areas EMA: EMAD and EMAT, non-emission areas NEA, and transistor areas TRA: TRAD and TRAT, respectively. An organic light-emitting diode OLED (see FIG. 4) including an emissive layer 190 (see FIG. 5) may be located in each of the emission areas EMA: EMAD and EMAT to emit light. The non-emission area NEA may refer to an area where a light-emitting material, such as an organic emission layer, is not located. Circuits or lines for driving the pixels PX may be located in the non-emission area NEA. It is, however, to be understood that the present disclosure is not limited thereto.

In the transistor areas TRA: TRAD and TRAT, at least one thin-film transistor TFT (hereinafter referred to as a transistor TR), which is electrically connected to an organic light-emitting diode OLED and transfers electric signal to the organic light-emitting diode OLED to drive it. Although the transistor area TRAT of the transmissive display area pixel PXT includes the transistor TR in the drawings, the transistor area TRAD of the display-only area pixel PXD also includes a transistor TR. The transistor areas TRA: TRAD and TRAT will be described in detail later.

The emission areas EMAD: EMAD_R, EMAD_G, and EMAD_B and the transistor areas TRAD: TRAD_R, TRAD_G, and TRAD_B of the display-only area pixels PXD: PXD_R, PXD_G, and PXD_B may be located in the display-only area DPA_D. That is, the emission areas EMAD: EMAD_R, EMAD_G, and EMAD_B and the transistor areas TRAD: TRAD_R, TRAD_G, and TRAD_B of the display-only area pixels PXD: PXD_R, PXD_G, and PXD_B may be located in the same area (e.g., in the display-only area DPA_D).

The emission areas EMAD_R, EMAD_G, and EMAD_B of the display-only area pixels PXD_R, PXD_G, and PXD_B for emitting lights of different colors may be arranged repeatedly in a sequence along the first direction D1. For example, in the display-only area DPA_D, the emission area EMAD_R of the red pixel PX_R, the emission area EMAD_G of the green pixel PX_G, the emission area EMAD_B of the blue pixel PX_B, and another emission area EMAD_G of the green pixel PX_G may be repeatedly arranged in this order.

Along the second direction D2, two of the emission areas EMAD_R, EMAD_G, and EMAD_B of the display-only area pixels PXD_R, PXD_G, and PXD_B for emitting lights of different colors may be arranged repeatedly, and/or one of the emission areas EMAD_R, EMAD_G, and EMAD_B emitting the light of the same color may be arranged repeatedly. For example, along the second direction D2 in the display-only area DPA_D, the emission area EMAD_R of the red pixel PX_R and the emission area EMAD_B of the blue pixel PX_B may be alternately arranged, and/or the emission area EMAD_G of the green pixel PX_G may be repeatedly arranged.

The transistor areas TRAD_R, TRAD_G, and TRAD_B of the display-only area pixels PXD_R, PXD_G, and PXD_B may be arranged in substantially the same manner as the emission areas EMAD_R, EMAD_G, and EMAD_B of the display-only area pixels PXD_R, PXD_G, and PXD_B. For example, the transistor areas TRAD_R, TRAD_G, and TRAD_B of the display-only area pixels PXD_R, PXD_G, and PXD_B may be arranged on the emission areas EMAD_R, EMAD_G, and EMAD_B of the display-only area pixels PXD_R, PXD_G, and PXD_B, respectively, so that they overlap each other. It is, however, to be understood that the present disclosure is not limited thereto.

The emission areas EMAT: EMAT_R, EMAT_G, and EMAT_B of the transmissive display area pixels PXT: PXT_R, PXT_G, and PXT_B may be located in the transmissive display area DPA_T. The transistor areas TRAT: TRAT_R, TRAT_G, and TRAT_B of the transmissive display area pixels PXD: PXD_R, PXD_G, and PXD_B may be located in the non-display area NDA. That is, the emission areas EMAT_R, EMAT_G, and EMAT_B and the transistor areas TRAT_R, TRAT_G, and TRAT_B of the transmissive display area pixels PXT_R, PXT_G, and PXT_B may be located in different areas so that they do not overlap each other.

Although the transistor areas TRAT_R, TRAT_G, and TRAT_B of the transmissive display area pixels PXT_R, PXT_G, and PXT_B are located in the non-display area NDA in the drawings as an example, the present disclosure is not limited thereto. The transistor area TRAT_R, TRAT_G, and TRAT_B of the transmissive display area pixels PXT_R, PXT_G, and PXT_B may be located in the display area DPA.

A bezel (or a cover chassis) or a black matrix may be located on the transistor areas TRAT of the transmissive display area pixels PXT, and accordingly the transistor areas TRAT of the transmissive display area pixels PXT cannot be seen from the outside.

For example, along the first direction D1 in the transmissive display DPA_T, the emission area EMAT_R of the red pixel PX_R, the emission area EMAT_G of the green pixel PX_G, the emission area EMAT_B of the blue pixel PX_B, and another emission area EMAT_G of the green pixel PX_G, which emit lights of different colors, may be repeatedly arranged in this order.

For example, along the second direction D2 in the transmissive display DPA_T, the emission area EMAT_R of the red pixel PX_R and the emission area EMAT_G of the green pixel PX_G may be arranged alternately, and/or the emission area EMAT_B of the blue pixel PX_B and the emission area EMAT_G of the green pixel PX_G may be arranged alternately.

The transistor areas TRAT_R, TRAT_G, and TRAT_B of the transmissive display area pixels PXT_R, PXT_G, and PXT_B may be located on one side of the transistor areas TRAD_R, TRAD_G, and TRAD_B of the display-only area pixels PXD_R, PXD_G, and PXD_B in the second direction D2, and may be repeatedly arranged in a corresponding order along the first direction D1. The order in which the transistor areas TRAD_R, TRAD_G, and TRAD_B are arranged is not particularly limited herein. The order may vary depending on the arrangement of the emission areas EMAD_R, EMAD_G, and EMAD_B connected to the transistors TR of the transistor areas TRAD_R, TRAD_G, and TRAD_B.

For example, the transistor areas TRAT_R, TRAT_G, and TRAT_B of the transmissive display area pixels PXT_R, PXT_G, and PXT_B may be located on the upper side of the transistor areas TRAD_R, TRAD_G, and TRAD_B of the display-only area pixels PXD_R, PXD_G, and PXD_B. The transistor areas TRAT_R, TRAT_G, and TRAT_B of the transmissive display area pixels PXT_R, PXT_G, and PXT_B may be located closer to the non-display area NDA than the transistor areas TRAD_R, TRAD_G, and TRAD_B of the display-only area pixels PXD_R, PXD_G, and PXD_B are.

In other words, the transistor areas TRAT_R, TRAT_G, and TRAT_B of the transmissive display area pixels PXT_R, PXT_G, and PXT_B may not be located in the transmissive display area DPA_T. Accordingly, the light transmittance of the transmissive display area DPA_T may be improved, and accordingly the amount of light reaching the light sensing member 20 may be increased. When the light sensing member 20 is a camera or the like, it is possible to suppress or prevent distortion of an image captured by the light sensing member 20.

The display panel 10 may further include connection lines CL_R, CL_G, and CL_B. Even though the transistor areas TRAT_R, TRAT_G, and TRAT_B and the emission areas EMAT_R, EMAT_G, and EMAT_B of the transmissive display area pixels PXT_R, PXT_G, and PXT_B are located in different areas, the transistors TR of the transistor areas TRAT_R, TRAT_G, and TRAT_B may be electrically connected to the organic light-emitting diodes OLED of the emission areas EMAT_R, EMAT_G, and EMAT_B via the connection lines CL_R, CL_G, and CL_B.

The connection lines CL_R, CL_G, and CL_B may be extended from the transistor areas TRAT_R, TRAT_G, and TRAT_B of the transmissive display area pixels PXT_R, PXT_G, and PXT_B located in the non-display area NDA and may be physically and/or electrically connected to the organic light-emitting diodes OLED of the emission areas EMAT_R, EMAT_G, and EMAT_B located in transmissive display area DPA_T.

The width of each of the connection lines CL_R, CL_G, and CL_B may be, for example, in the range of about 1.2 μm to about 1.5 μm, or about 0.5 μm to about 2.0 μm. It is, however, to be understood that the present disclosure is not limited thereto. In other words, each of the connection lines CL_R, CL_G, and CL_B may have a width measured in a direction that is perpendicular to the direction in which the connection lines CL_R, CL_G, and CL_B are extended. The width may be in the range of about 1.2 μm to about 1.5 μm, or may be in the range of about 0.5 μm to about 2.0 μm. For example, the width of each of the connection lines CL_R, CL_G, and CL_B located in the transmissive display area DPA_T and extended in the second direction D2 may be in the range of about 1.2 μm to about 1.5 μm, or in the range of about 0.5 μm to about 2.0 μm.

If the width of each of the connection lines CL_R, CL_G, and CL_B is less than about 1.5 μm or less than about 2.0 μm, the connection lines CL_R, CL_G, and CL_B may be less visible. In addition, when the width of each of the connection lines CL_R, CL_G, and CL_B is greater than about 0.5 μm or greater than about 1.2 μm, the electrical resistance of the lines may be reduced. That is, when the width of each of the connection lines CL_R, CL_G, and CL_B are within the above ranges, it is possible to reduce the electrical resistance while reducing or preventing visibility of the lines from the outside.

At least a part of each of the connection lines CL_R, CL_G, and CL_B may be located in the transmissive display area DPA_T. An anti-reflection layer RL (refer to FIG. 6) may be located on each of the connection lines CL_R, CL_G, and CL_B located in the area. Accordingly, the connection lines CL_R, CL_G, and CL_B are not recognized from the outside. Detailed descriptions thereon will be given later.

The transmitting areas TA may be located in the other areas of the transmissive display area DPA_T excluding the emission areas EMAT_R, EMAT_G, and EMAT_B of the transmissive display area pixels PXT_R, PXT_G, and PXT_B. The transmitting areas TA may be located in some areas of the transmissive display area DPA_T excluding the emission areas EMAT_R, EMAT_G, and EMAT_B of the transmissive display area pixels PXT_R, PXT_G, and PXT_B or may be located in the entire transmissive display area DPA_T.

Hereinafter, a circuit diagram and a stack structure of the display-only area pixels PXD and the transmissive display area pixels PXT will be described in detail.

Figure 4:
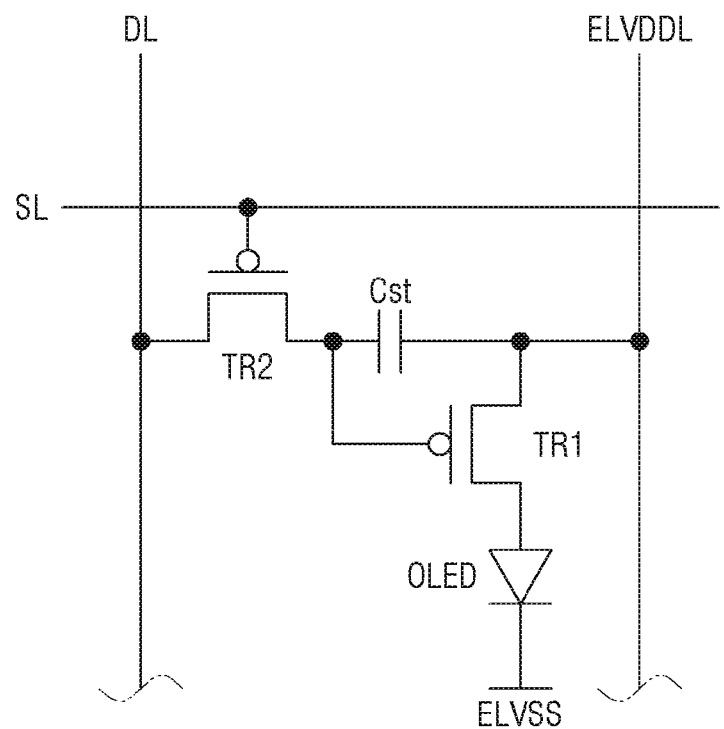
FIG. 4 is a circuit diagram of one pixel of a display device according to some embodiments of the present disclosure.

FIG. 4 is a circuit diagram of one pixel of a display device according to some embodiments of the present disclosure.

Referring to FIG. 4, the pixel circuit may include transistors TR, a capacitor Cst, and an organic light-emitting diode OLED. A scan line SL, a data line DL, and a first supply voltage line ELVDDL are connected to each pixel circuit.

The transistors TR may include a first transistor TR1 and a second transistor TR2. The first transistor TR1 may be a driving transistor, and the second transistor TR2 may be a switching transistor. Although both the first transistor TR1 and the second transistor TR2 are PMOS transistors in the drawings, the first transistor TR1 and/or the second transistor TR2 may be NMOS transistors in other embodiments.

The first electrode (source electrode) of the first transistor TR1 is connected to the first supply voltage line ELVDDL, and the second electrode (drain electrode) is connected to the anode electrode of the organic light-emitting diode OLED. The first electrode (source electrode) of the second transistor TR2 is connected to the data line DL, and the second electrode (drain electrode) thereof is connected to the gate electrode of the first transistor TR1. The capacitor Cst is connected between the gate electrode and the first electrode of the first transistor TR1. The cathode electrode of the organic light-emitting diode OLED receives the second supply voltage ELVSS. The second supply voltage ELVSS may have a voltage level that is lower than that of the first supply voltage ELVDD applied from the first supply voltage line ELVDDL.

The second transistor TR2 may output a data signal applied to the data line DL in response to a scan signal applied to the scan line GL. The capacitor Cst is charged with the voltage corresponding to the data signal received from the second transistor TR2. The first transistor TR1 may control the driving current flowing in the organic light-emitting diode OLED in response to the amount of charges stored in the capacitor Cst.

The numbers of the transistors TR and the capacitors Cst of the pixel circuit may be changed. In the foregoing description, the pixel circuit having a 2T1C structure including two transistors TR1 and TR2 and one capacitor Cst will be described as an example. It is, however, to be understood that the present disclosure is not limited thereto. A variety of modified pixel structure may be employed such as a 3T1C structure, a 7T1C structure, or a 6T1C structure.

Figure 5:
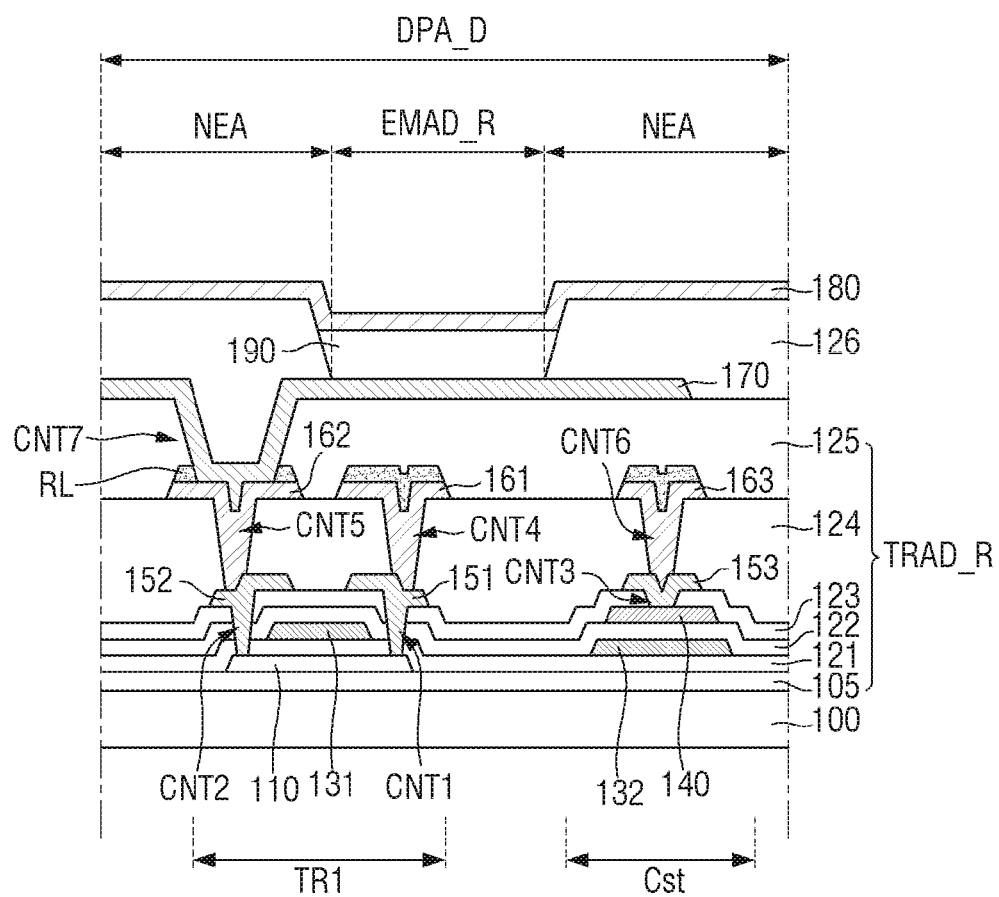
FIGS. 5 and 6 are cross-sectional views of pixels of a display panel according to some embodiments.
Figure 6:
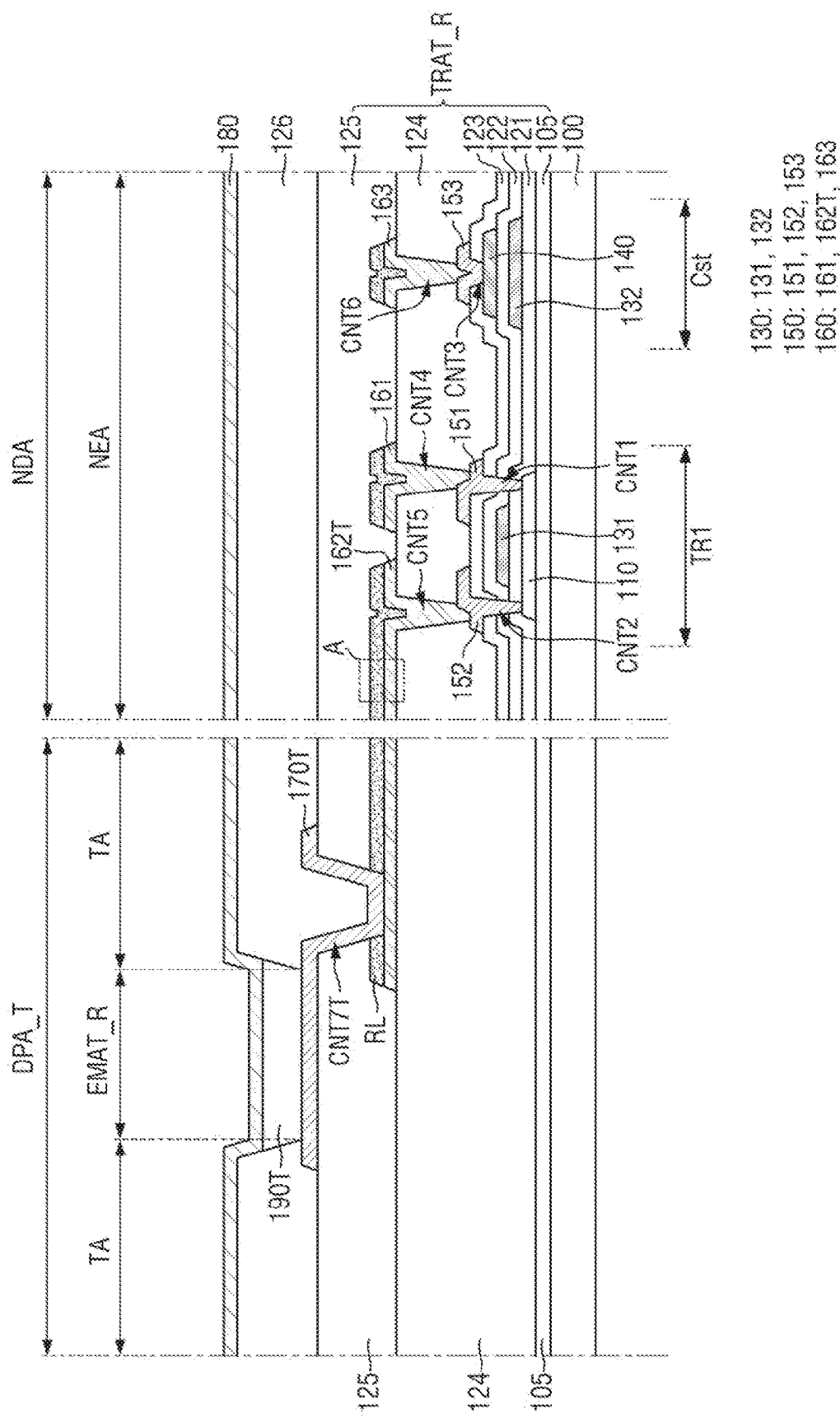

FIGS. 5 and 6 are cross-sectional views of pixels of a display panel according to some embodiments. FIG. 5 is an example of a pixel PX of the display panel 10 according to some embodiments, showing a stack structure of a red pixel PXD_R of the display-only area pixel PXD. FIG. 6 is an example of a pixel PX of the display panel 10 according to some embodiments, showing a stack structure of a red pixel PXT_R of the transmissive display area pixel PXT. FIG. 6 is a cross-sectional view showing in the vicinity of an emission area EMAT_R and a transistor area TRAT_R of a red pixel PXT_R of the transmissive display area pixel PXT.

Initially, a cross-sectional structure of the display-only area pixel PXD will be described with reference to FIG. 5. In FIG. 5, as an example of the display-only area pixels PXD of the display panel 10, a stack structure of a red pixel PXD_R of the display-only area pixels PXD is shown. For example, FIG. 5 shows a first transistor TR1 and a capacitor Cst of the red pixel PXD_R of the display-only area pixels PXD. The description on the stack structure of the red pixel PXD_R of the display-only area pixel PXD may be equally applied to a green pixel PXD_G, and a blue pixel PXD_B.

The display panel 10 may include a substrate 100, a buffer layer 105, a semiconductor layer 110, a first insulating layer 121, a first conductive layer 130, a second insulating layer 122, a second conductive layer 140, a third insulating layer 123, a third conductive layer 150, a fourth insulating layer 124, a fourth conductive layer 160, a fifth insulating layer 125, a fifth conductive layer 170, a bank 126 including an opening for exposing the fifth conductive layer 170, an emissive layer 190 located within the opening of the bank 126, and a sixth conductive layer 180 located on the emissive layer 190 and the bank 126. Each of the layers described above may be made up of a single layer, or a stack of layers including a plurality of layers. Other layers may be further located between the layers.

The transistor area TRAT of the red pixel PXD_R of the display-only area pixel PXD may include the buffer layer 105, the semiconductor layer 110, the first insulating layer 121, the first conductive layer 130, the second insulating layer 122, the second conductive layer 140, the third insulating layer 123, the third conductive layer 150, the fourth insulating layer 124, the fourth conductive layer 160, and the fifth insulating layer 125.

The substrate 100 supports the layers located thereon. The substrate 100 may be made of an insulating material such as a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate 100 may be a flexible substrate that may be bent, folded, or rolled. An example of the material of the flexible substrate may be, but is not limited to, polyimide (PI).

The buffer layer 105 is located on the substrate 100. The buffer layer 105 may reduce or prevent diffusion of impurity ions, may reduce or prevent permeation of moisture or outside air, and may provide a flat surface. The buffer layer 105 may include silicon nitride, silicon oxide, silicon oxynitride, or the like. The buffer layer 105 may be eliminated depending on the type of the substrate 100, process conditions, etc.

The semiconductor layer 110 is located on the buffer layer 105. The semiconductor layer 110 forms a channel of the first thin-film transistor TR1 of the red pixel PXD_R. The semiconductor layer 110 may include polycrystalline silicon. It is, however, to be understood that the present disclosure is not limited thereto. The semiconductor layer 110 may include monocrystalline silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc.

The first insulating layer 121 may be a gate insulating layer having a gate insulating function. The first insulating layer 121 may include an inorganic material. The first insulating layer 121 may include a silicon compound, a metal oxide, etc. For example, the first insulating layer 121 may include silicon oxide, silicon nitride, silicon oxynitride, aluminum oxide, tantalum oxide, hafnium oxide, zirconium oxide, titanium oxide, etc. They may be used alone or in combinations. The first insulating layer 121 is located on the semiconductor layer 110 and may be located over the entire surface of the substrate 100.

The first conductive layer 130 is located on the first insulating layer 121. The first conductive layer 130 may be a first gate conductive layer. The first conductive layer 130 may include a gate electrode 131 of the first thin-film transistor TR1 of the red pixel PXD_R, a scan line connected thereto, and a first electrode 132 of a storage capacitor. The first conductive layer 130 may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu).

A second insulating layer 122 may be located on the first conductive layer 130. The second insulating layer 122 may be an interlayer dielectric layer. The second insulating layer 122 may be made of, but is not limited to, the same material as the first insulating layer 121.

The second conductive layer 140 is located on the second insulating layer 122. The second conductive layer 140 may be a second gate conductive layer. The second conductive layer 140 may include a second electrode 140 of the storage capacitor. The second conductive layer 140 may be made of, but is not limited to, the same material as the first conductive layer 130.

A third insulating layer 123 is located on the second conductive layer 140. The third insulating layer 123 may be an interlayer dielectric layer. The third insulating layer 123 may be made of, but is not limited to, the same material as the first insulating layer 121.

The third conductive layer 150 is located on the third insulating layer 123. The third conductive layer 150 may be a first source/drain conductive layer. The third conductive layer 150 may include a first electrode 151 and a second electrode 152 of the first thin-film transistor TR1 of the red pixel PXD_R. The first electrode 151 and the second electrode 152 of the first thin-film transistor TR1 may be electrically connected to the source region and the drain region of the semiconductor layer 110, respectively, through contact holes CNT1 and CNT2 passing through the third insulating layer 123, the second insulating layer 122, and the first insulating layer 121. A first supply voltage line 153 of the red pixel PXD_R may also be formed as the third conductive layer 150. The first supply voltage line 153 may be electrically connected to the second electrode 140 of the storage capacitor through a contact hole CNT3 penetrating through the third insulating layer 123.

The third conductive layer 150 may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu). The third conductive layer 150 may be made up of a single layer or multiple layers. For example, the third conductive layer 150 may have a stack structure of Ti/Al/Ti, Mo/Al/Mo, Mo/AlGe/Mo, and/or Ti/Cu.

The fourth insulating layer 124 is located on the third conductive layer 150. The fourth insulating layer 124 covers the third conductive layer 150. The fourth insulating layer 124 may include an organic material. The fourth insulation layer 124 may be a via layer. The fourth insulating layer 124 may include an organic insulating material such as polyacrylate resin, epoxy resin, phenolic resin, polyamide resin, polyimide resin, unsaturated polyesters resin, poly phenylene ether resin, poly phenylene sulfide resin, and benzocyclobutene (BCB).

The fourth conductive layer 160 is located on the fourth insulating layer 124. The fourth conductive layer 160 may be a second source/drain conductive layer. The fourth conductive layer 160 may include a data line, a connection electrode 162, and first supply voltage lines 161 and 163 of the red pixel PXD_R. The first supply voltage line 161 may be electrically connected to the first electrode 151 of the first thin-film transistor TR1 of the red pixel PXD_R through a contact hole CNT4 passing through the fourth insulating layer 124 in the red pixel PXD_R. The connection electrode 162 may be electrically connected to the second electrode 152 of the first thin-film transistor TR1 of the red pixel PXD_R through the contact hole CNT5 passing through the fourth insulating layer 124. The first supply voltage line 163 may also be electrically connected to the first supply voltage line 153 through a contact hole CNT6 passing through the fourth insulating layer 124.

The fourth conductive layer 160 may include the same material as the third conductive layer 150, and the fourth conductive layer 160 may include a stack of multiple layers. The fourth conductive layer 160 may be made of the same material and the same stack structure as the third conductive layer 150. For example, the fourth conductive layer 160 may include, but is not limited to, a stack structure of Ti/Al/Ti.

An anti-reflection layer RL is located on the fourth conductive layer 160. The anti-reflection layer RL may be formed in substantially the same pattern as the fourth conductive layer 160. The anti-reflection layer RL may include an opaque metal, and the anti-reflection layer RL may have a higher electrical resistance than that of the fourth conductive layer 160. The anti-reflection layer RL may include molybdenum (Mo), a molybdenum alloy, a molybdenum oxide (MoOx), or an oxide of a molybdenum alloy. The oxide of a molybdenum alloy may include at least one selected from the group consisting of: molybdenum tantalum oxide (MoTaOx), molybdenum titanium oxide (MoTiOx), and/or molybdenum copper oxide (MoCuOx).

If a connection electrode 162T (see FIG. 6) is optically transparent, a distorted image may be recognized by the light sensing members 20 (see FIG. 2) due to a difference in refractive index of the connection electrode 162T located in the transmissive display area DPA_T, or defects such as spots may occur. In contrast, when the fourth conductive layer 160 includes an opaque metal, it is possible to suppress or prevent defects such as image distortion and spots that may occur due to a difference in refractive index, even though the connection electrode 162T is optically opaque. In addition, when the connection electrode 162T includes the width of the above-described range, it is possible to prevent the electrode from being seen from the outside.

The anti-reflection layer RL may cover the fourth conductive layer 160 excluding a region exposed via a contact hole CNT7. The anti-reflection layer RL may expose a part of the fourth conductive layer 160 through the contact hole CNT7. The fourth conductive layer 160 and the fifth conductive layer 170 having a relatively low electrical resistance may be in direct contact with each other, and thus the contact resistance may be reduced. Accordingly, the fourth conductive layer 160 and the fifth conductive layer 170 may be electrically connected more effectively, and the display device 1 may operate more reliably.

The anti-reflection layer RL may absorb external light, and may suppress or prevent reflection of external light. Accordingly, even when the fourth conductive layer 160 is optically opaque, it is possible to reduce or prevent visibility of the fourth conductive layer 160 from the outside by virtue of the anti-reflection layer RL covering the fourth conductive layer 160. Detailed descriptions thereon will be given later.

A fifth insulating layer 125 is located on the anti-reflection layer RL. The fifth insulating layer 125 covers the fourth conductive layer 160 and the anti-reflection layer RL. The fifth insulation layer 125 may be a via layer. The fifth insulating layer 125 may include the same material as the fourth insulating layer 124, or may include one or more materials selected from the materials listed above as the materials of the fourth insulating layer 124.

The fifth conductive layer 170 is located on the fifth insulating layer 125. The anode electrode, which is the pixel electrode, may be formed as the fifth conductive layer 170. The anode electrode may be electrically connected to the connection electrode 162 formed as the fourth conductive layer 160 through the contact hole CNT7 penetrating through the fifth insulating layer 125 and the anti-reflection layer RL, and may be connected to the second electrode 152 of the first transistor TR1 therethrough. The anode electrode may at least partially overlap the emission area EMAD_R of the red pixel PXD_R.

The fifth conductive layer 170 may have a stack structure of a material layer having a high work function such as indium-tin-oxide (ITO), indium-zinc-oxide (IZO), zinc oxide (ZnO), and/or indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) and/or a mixture thereof. A layer having a higher work function may be located on a reflective material layer so that it is located closer to the emissive layer 190. The fifth conductive layer 170 may have, but is not limited to, a multilayer structure of ITO/Mg, ITO/MgF, ITO/Ag, and/or ITO/Ag/ITO.

The bank 126 may be located on the fifth conductive layer 170. The bank 126 may at least partially overlap the non-emission area NEA of the red pixel PXD_R. The bank 126 may include an opening exposing the fifth conductive layer 170. The bank 126 may include inorganic insulating materials such as silicon oxide, silicon nitride, silicon oxynitride, hafnium oxide, aluminum oxide, titanium oxide, tantalum oxide, and/or zinc oxide, or an organic insulating material such as polyacrylates resin, epoxy resin, phenolic resin, polyamides resin, polyimides resin, unsaturated polyesters resin, poly phenylenethers resin, polyphenylenesulfides resin, and/or benzocyclobutene (BCB). The bank 126 may be made up of a single layer or multiple layers of different materials stacked on one another.

The emissive layer 190 is located in the opening of the bank 126. The emissive layer 190 may include an organic emissive layer, a hole injecting/transporting layer, and an electron injecting/transporting layer. The emissive layer 190 may overlap the emission area EMAD_R.

A sixth conductive layer 180 is located on the emissive layer 190 and the bank 126. The cathode electrode, which is the common electrode, may be formed as the sixth conductive layer 180. The cathode electrode may also be located in the non-emission area NEA as well as the emission area EMAD_R of the red pixel PXD_R. In other words, the cathode electrode may be located on the entire surface of each of the red pixels PXD_R. The sixth conductive layer 180 may include a material having a small work function such as Li, Ca, LiF/Ca, LiF/Al, Al, Mg, Ag, Pt, Pd, Ni, Au, Nd, Ir, Cr, BaF, Ba, or a compound or mixture thereof. The sixth conductive layer 180 may further include a transparent metal oxide layer located on the material layer having a small work function.

In some embodiments, an encapsulation layer may be located on the sixth conductive layer 180. The encapsulation layer may include an inorganic layer. According to some embodiments of the present disclosure, the encapsulation layer may include a first inorganic layer, an organic layer on the first inorganic layer, and a second inorganic layer on the organic layer.

Subsequently, a cross-sectional structure of the transmissive display area pixel PXT will be described with reference to FIG. 6. The transmissive display area pixel PXT may have substantially the same configuration as the display-only area pixel PXD.

In the following description, like reference numerals are assigned to denote like or similar elements, and the following description will focus on the differences between the transmissive display area pixels PXT and display-only area pixels PXD. In addition, as an example of the transmissive display area pixels PXD of the display panel 10, a stack structure of a red pixel PXT_R of the transmissive display area pixels PXD is shown. For example, FIG. 6 shows a first transistor TR1 and a capacitor Cst of the red pixel PXT_R of the transmissive display area pixels PXT. The description on the stack structure of the red pixel PXT_R of the transmissive display area pixel PXT may be equally applied to a green pixel PXT_G, and a blue pixel PXT_B.

The first to third insulating layers 121, 122, and 123 may be omitted from the transmissive display area DPA_T. In other words, in the transmissive display area DPA_T, the fourth insulating layer 124 may be located on the buffer layer 105, and the first to third insulating layers 121, 122, and 123 may be eliminated between the buffer layer 105 and the fourth insulating layer 124. Accordingly, the light transmittance of the transmissive display area DPA_T may be improved. It is, however, to be understood that the present disclosure is not limited thereto. If the first to third insulating layers 121, 122, and 123 are optically transparent, at least one or all of the first to third insulating layers 121, 122, and 123 may be located in the transmissive display area DPA_T.

When the first to third insulating layers 121, 122, and 123 are not located in the transmissive display area DPA_T, the first to third insulating layers 121, 122, and 123 may be formed in the transmissive display area DPA_T, and then may be removed by etching or the like. It is, however, to be understood that the present disclosure is not limited thereto.

Even though the buffer layer 105 and the first to third insulating layers 121, 122, and 123 formed in the transmissive display area DPA_T are eliminated, the upper surface of the fourth insulating layer 124 may be generally flat by virtue of the fourth insulating layer located across the transmissive display area DPA_T and the non-display area NDA, despite the level differences thereunder.

The fourth conductive layer 160 of the red pixel PXT_R of the transmissive display area pixel PXT may include the data line, the connection electrode 162T, and the first supply voltage lines 161 and 163 of the red pixel PXT_R. The connection electrode 162T of the red pixel PXT_R of the transmissive display area pixel PXT may have substantially the same configuration as at least one of the connection lines CL_R, CL_G, and CL_B of FIG. 3.

The connection electrode 162T of the red pixel PXT_R of the transmissive display area pixel PXT may include substantially the same material as the elements of the fourth conductive layer 160 to form the fourth conductive layer 160. For example, the connection electrode 162T may include substantially the same material as the data line and the first supply voltage lines 161 and 163 of the red pixel PXT_R of the transmissive display area pixel PXT, may include substantially the same material as the data line of the display-only area pixel PXD (see FIG. 5), the connection electrode 162 (see FIG. 5) and the first supply voltage lines 161 and 163 (see FIG. 5), and may have the same stack structure. In other words, the connection electrode 162T of the red pixel PXT_R of the transmissive display area pixel PXT may be formed via the same process as the elements of the fourth conductive layer 160, and thus no additional process is required. As a result, the processing efficiency may be improved. Detailed descriptions thereon will be given later.

The connection electrode 162T of the red pixel PXT_R of the transmissive display area pixel PXT may be electrically connected to the second electrode 152 of the first transistor TR1, and may be electrically connected to a fifth conductive layer 170T that is the anode electrode of the red pixel PXT_R of the transmissive display area pixel PXT. An emissive layer 190T of the red pixel PXT_R of the transmissive display area pixel PXT may be located on the fifth conductive layer 170T. The fifth conductive layer 170T and the emissive layer 190T may be located in the transmissive display area DPA_T.

Although the present disclosure is not limited thereto, the fifth conductive layer 170T of the red pixel PXT_R of the transmissive display area pixel PXT and the connection electrode 162T may be electrically connected in the transmissive display area DPA_T. In other words, the fifth conductive layer 170T and the connection electrode 162T may be physically and/or electrically connected to each other via a through hole CNT7T penetrating the fifth insulating layer 125, and the through hole CNT7T may be located in the transmissive display area DPA_T. The connection electrode 162T may be exposed via the contact hole CNT7T formed in the anti-reflection layer RL. Accordingly, the connection electrode 162T and the fifth conductive layer 170 may be electrically connected with each other more smoothly, thereby facilitating the operation of the display device 1.

The transistor area TRAT_R including the first transistor TR1 of the red pixel PXT_R of the transmissive display area pixel PXT may be located in the non-display area NDA, and the organic light-emitting diode OLED including the fifth conductive layer 170 that is the anode electrode of the red pixel PXT_R of the transmissive display area pixel PXT may be located in the transmissive display area DPA_T. Accordingly, the connection electrode 162T of the red pixel PXT_R of the transmissive display area pixel PXT may be extended from the transistor area TRAT_R of the non-display area NDA to the transmissive display area DPA_T.

That is, the connection electrode 162T of the red pixel PXT_R of the transmissive display area pixel PXT may be located over two different areas. For example, the connection electrode 162T of the red pixel PXT_R of the transmissive display area pixel PXT may be located over the non-display area NDA and the transmissive display area DPA_T. Alternatively, when the transistor area TRAT_R of the red pixel PXT_R of the transmissive display area pixel PXT is located on the non-display area NDA, the connection electrode 162T of the red pixel PXT_R of the transmissive display area pixel PXT may be located over the non-display area NDA and the transmissive display area DPA_T.

The connection electrode 162T may form a single line. In other words, the connection electrode 162T may include the part connected to the fifth conductive layer 170T through the through hole CNT7T and the part connected to the second electrode 152 of the first transistor TR1 through the through hole CNT5, which are continuously connected to each other. Accordingly, a contact hole is not required which connects between different lines of the connection electrode 162T, and thus a space for locating the connection electrode 162T may be reduced. As a result, the spacing between the connection lines CL_R, CL_G, and CL_B (see FIG. 3) may be reduced, thereby allowing for high integration. Moreover, a process of forming the contact hole is not required, and thus the process may be simplified.

It is, however, to be understood that the present disclosure is not limited thereto. A part of the connection electrode 162T may be included in the fourth conductive layer 160, and another part thereof may be included in the third conductive layer 150. For example, a part of the second electrode 152 of the first transistor TR1 of the third conductive layer 150 may be extended to the transmissive display area DPA_T to form a part of the connection electrode 162T.

An anti-reflection layer RL may be located on the fourth conductive layer 160. The anti-reflection layer RL may be located on at least the connection electrode 162T located in the transmissive display area DPA_T. Accordingly, even though the connection electrode 162T is located in the display area DPA (or the transmissive display area DPA_T) rather than in the bezel area (or the non-display area NDA), it is possible to more effectively suppress or prevent visibility of the electrode from the outside. The anti-reflection layer RL will be described in more detail with reference to FIG. 7.

Figure 7:
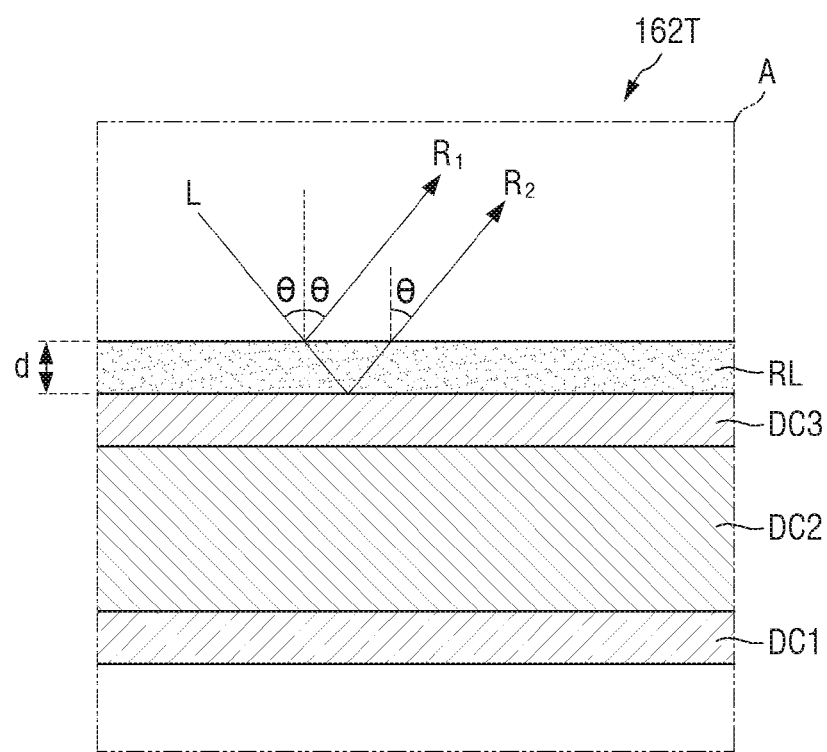
FIG. 7 is an enlarged view of area A of FIG. 6.

FIG. 7 is an enlarged view of area A of FIG. 6. FIG. 7 shows the connection electrode 162T of the red pixel PXT_R of the transmissive display area pixel PXT as an example of the fourth conductive layer 160. However, the description on the connection electrode 162T is not limited to the connection electrode 162T, but may be equally applied to all of the elements included in the fourth conductive layer 160 in some embodiments.

Referring to FIG. 7, the connection electrode 162T of the red pixel PXT_R of the transmissive display area pixel PXT may include a first conductive metal layer DC1, a second conductive metal layer DC2 and a third conductive metal layer DC3. The second conductive metal layer DC2 may be located on the first conductive metal layer DC1, and the third conductive metal layer DC3 may be located on the second conductive metal layer DC2. That is, the second conductive metal layer DC2 may be located between the first conductive metal layer DC1 and the third conductive metal layer DC3, and the third conductive metal layer DC3 may be located above the first conductive metal layer DC1.

Although the present disclosure is not limited thereto, for example, the first conductive metal layer DC1 and the third conductive metal layer DC3 may include titanium (Ti), and the second conductive metal layer DC2 may include aluminum (Al).

The anti-reflection layer RL is located on the connection electrode 162T of the red pixel PXT_R of the transmissive display area pixel PXT. The anti-reflection layer RL may absorb external light L directed to the connection electrode 162T. Even when a part of the external light L is reflected, reflected light R1 and R2 may be canceled, so that it is possible to suppress or prevent reflection of external light that may be caused by the connection electrode 162T.

For example, the external light L incident on the anti-reflection layer RL may be reflected at the upper lower interfaces of the anti-reflection layer RL. The reflected lights R1 and R2 formed by the reflection may be in anti-phase, or opposite phase, and may substantially cancel each other out. The reflected lights R1 and R2 reflected at the upper and lower interfaces of the anti-reflection layer RL, respectively, may be in anti-phase so that they may be cancelled when the thickness d of the anti-reflection layer RL satisfies Equation 1 below:

$$d \cdot \cos\theta = 2m \cdot \lambda/4 \qquad \text{Equation 1}$$

where $\lambda$ denotes the wavelength of external light L, m denotes an integer, and $\theta$ denotes the angle of incidence or reflection.

The connection electrode 162T cannot be seen even though it is located in the display area DPA when the anti-reflection layer RL includes molybdenum (Mo), a molybdenum alloy, a molybdenum oxide (MoOx), or an oxide of a molybdenum alloy, and when the thickness satisfies Equation 1.

The reflectance of external light of the connection electrode 162T depending on whether the anti-reflection layer RL is used will be described with reference to FIG. 8.

Figure 8:
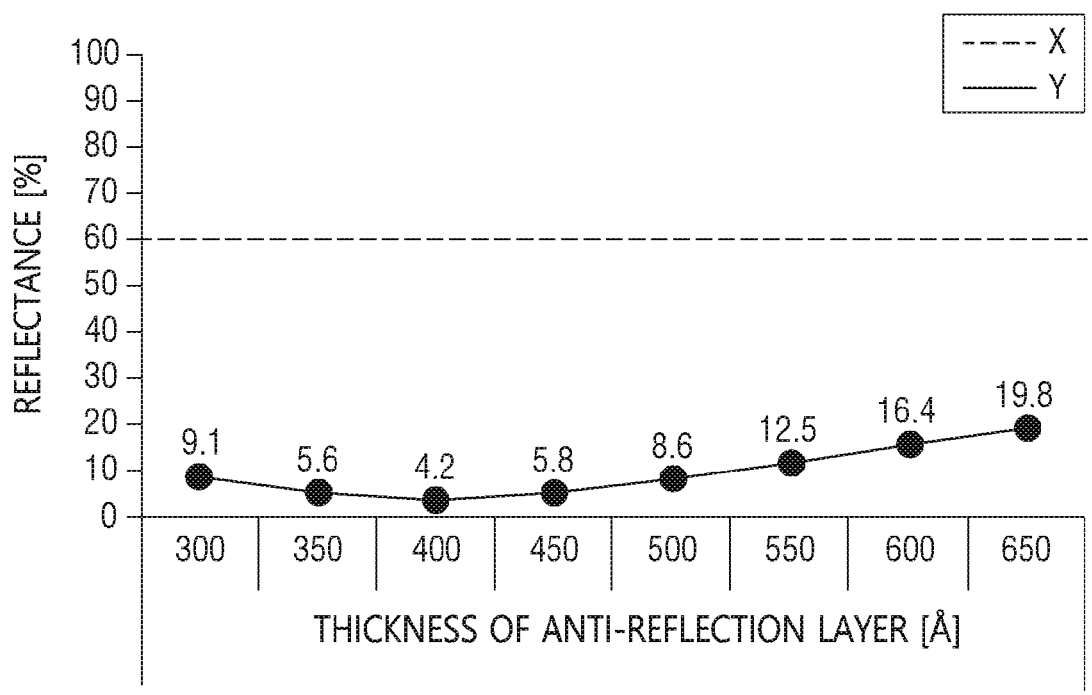
FIG. 8 is a graph showing reflectance of external light depending on whether the anti-reflection layer is located or not according to some embodiments of the present disclosure.

FIG. 8 is a graph showing reflectance of external light depending on whether the anti-reflection layer is used or not according to some embodiments of the present disclosure. The horizontal axis represents the thickness of an anti-reflection layer RL, and the vertical axis represents the reflectance (%) of a metal layer. The dashed line indicated by X exhibits the reflectance of the external light of the metal layer from which the antireflection layer RL is eliminated, and the curved line indicated by Y exhibits the reflectance of the external light of the metal layer covered by the anti-reflection layer RL.

Referring to FIG. 8, the dashed line indicated by X shows a reflectance of external light of approximately 60% when the anti-reflection layer RL is not located on the metal layer (e.g., on the connection electrode 162T). The curved line indicated by Y shows respective reflectances of the external light in the range of about 4.2% to about 19.8% when the anti-reflection layer RL is located on the metal layer (e.g., on the connection electrode 162T), even though there may be deviations depending on the thickness of the anti-reflection layer RL. That is, the reflectance of the external light may be reduced significantly when the anti-reflection layer RL is located on the metal layer (e.g., the connection electrode 162T), as compared to when the anti-reflection layer RL is not located on the metal layer (e.g., not located on the connection electrode 162T).

When the transistor areas TRAT and the emission areas EMAT of the transmissive display area pixels PXT are located in different areas, and when the transistors TR of the transistor areas TRAT and the organic light-emitting diodes OLED of the emission areas EMAT are physically and/or electrically connected by the connection electrode 162T, at least a part of the connection electrode 162T may be located in the transmissive display area DPA_T. In this case, it is possible to suppress or prevent visibility of the connection electrode 162T from the outside by virtue of the anti-reflection layer RL covering the connection electrode 162T.

Accordingly, as the transistor TR is not located in the transmissive display area DPA_T, the light transmittance of the transmissive display area DPA_T may be improved, and the amount of light incident on the light sensing member 20 (see FIG. 2) thereunder may be increased. Accordingly, the light sensing member 20 may operate better, and it is possible to suppress or prevent defects such as haze when the light sensing member 20 includes a camera, etc.

In addition, even though the connection electrode 162T is located in the transmissive display area DPA_T, which physically and/or electrically connects the organic light-emitting diode OLED in the emission area EMA located in the transmissive display area DPA_T with the transistor TR located in a different area (e.g., in the non-display area NDA), it is possible to suppress or prevent visibility of the connection electrode 162T from the outside by locating the anti-reflection layer RL on the connection electrode 162T. Accordingly, a user may experience more immersive content.

Figure 9:
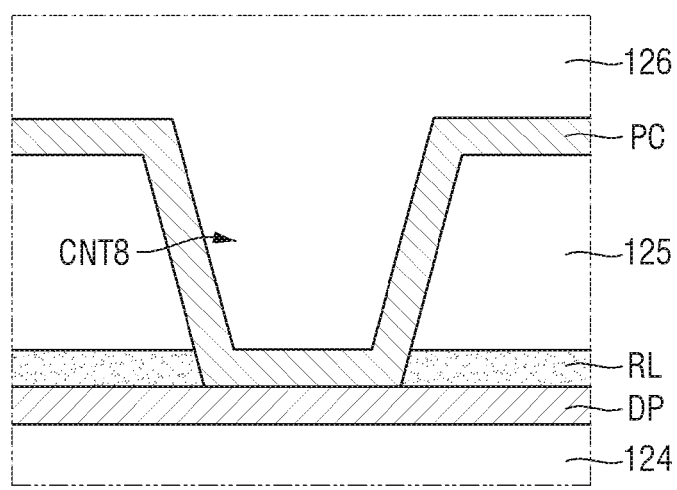
FIG. 9 is a cross-sectional view showing a pad area of the display panel.

The anti-reflection layer RL may also be located on a pad area of the display panel 10, and may be located on a data pad DP (see FIG. 9). This will be described with reference to FIG. 9.

FIG. 9 is a cross-sectional view showing a pad area of the display panel.

Referring to FIG. 9, the display panel 10 may further include a data pad DP and a data pad connection electrode PC physically and/or electrically connected to the data pad DP. The fourth conductive layer 160 may further include the data pad DP. The anti-reflection layer RL and the fifth insulating layer 125 may be located on the data pad DP, and the data pad connection electrode PC may be located on the fifth insulating layer 125. A data pad connection electrode 604 may receive a data signal from the data driver, and may transmit it to a data signal line 510.

The data pad connection electrode PC and the data pad DP may be physically and/or electrically connected to each other via a through hole CNT8 penetrating the fifth insulating layer 125 and the anti-reflection layer RL. The anti-reflection layer RL may expose at least a part of the data pad DP via the through hole CNT8. Accordingly, the data pad connection electrode PC and the data pad DP may be in direct contact with each other, and may be electrically connected with each other more smoothly.

Hereinafter, a method of fabricating a display device according to some embodiments of the present disclosure will be described.

FIGS. 10 to 14 are cross-sectional views for illustrating processing steps of a method of fabricating a display device according to some embodiments of the present disclosure.

Figure 10:
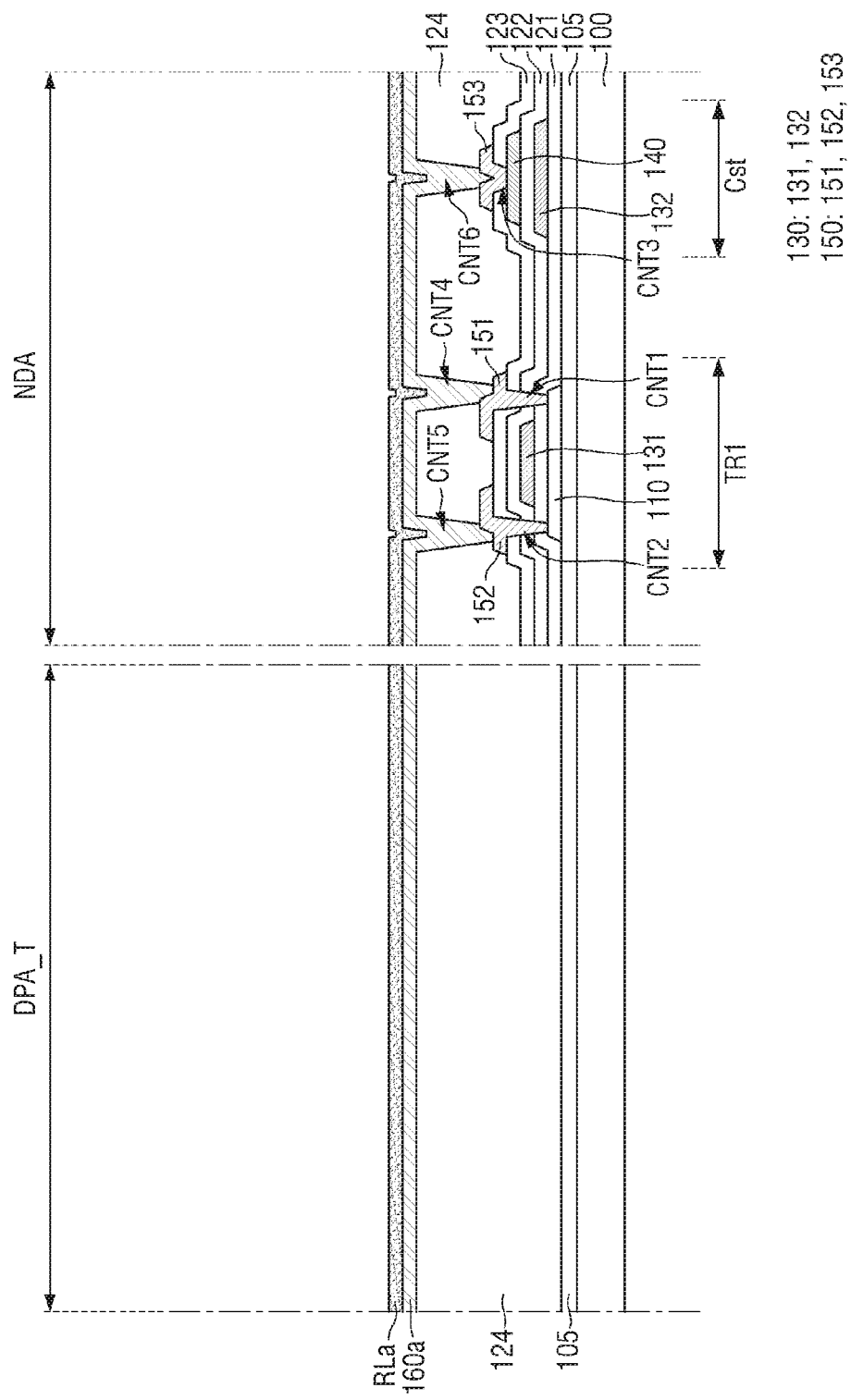
FIGS. 10 to 14 are cross-sectional views for illustrating processing steps of a method of fabricating a display device according to some embodiments of the present disclosure.

Referring first to FIG. 10, a buffer layer 105, a semiconductor layer 110, a first insulating layer 121, a first conductive layer 130, a second insulating layer 122, a second conductive layer 140, a third insulating layer 123, a third conductive layer 150, a fourth insulating layer 124, and contact holes CNT1, CNT2, CNT3, CNT4, CNT5, and CNT6 are formed on the substrate 100, and a material layer 160a for the fourth conductive layer and a material layer RLa for the anti-reflection layer are sequentially formed on the fourth insulating layer 124. The contact holes CNT4, CNT5, and CNT6 are filled with the material layer 160a and/or the material layer RLa, which may be formed throughout the substrate 100. The material layers 160a and RLa may be located across the non-display area NDA and the display area DPA.

Figure 11:
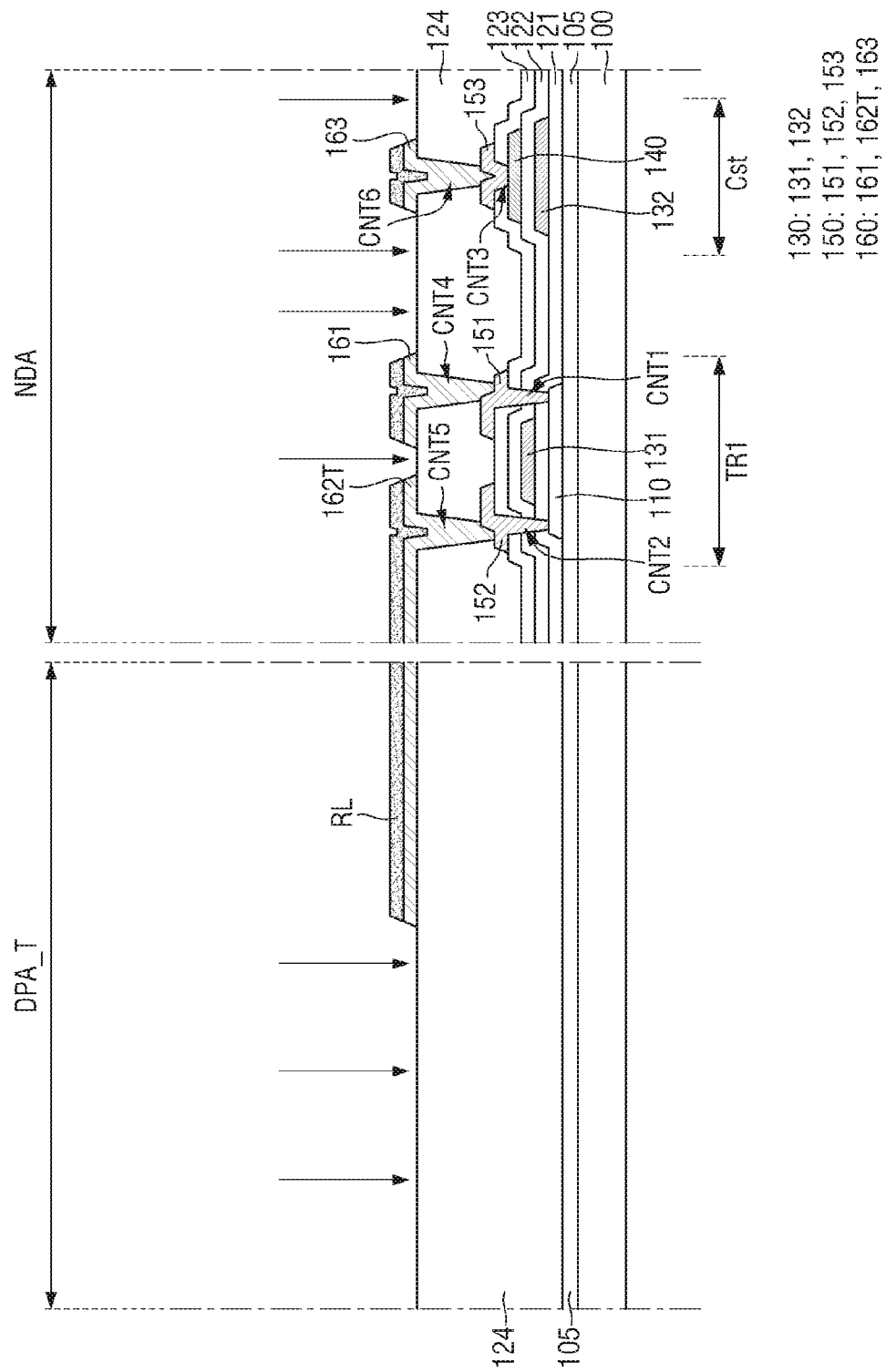

Subsequently, referring to FIG. 11, the material layers RLa and 160a are patterned. For example, a process of patterning the material layers RLa and 160a may be performed via a single mask process. A photoresist layer is applied on the material layers RLa and 160a that are entirely stacked on the substrate 100. Then, a photoresist pattern exposing a part of the material layer RLa and the material layer 160a by exposure and development. Subsequently, the material layers RLa and 160a are etched using the photoresist pattern. Subsequently, the photoresist pattern is removed via a strip or ashing process, and the fourth conductive layer 160 including the connection electrode 162T and the first supply voltage lines 161 and 163 and the anti-reflection layer RL as shown in FIG. 11 are formed.

Although the anti-reflection layer RL and the fourth conductive layer 160 are formed together in the drawings, the present disclosure is not limited thereto. The anti-reflection layer RL may be selectively removed and patterned using a photoresist pattern or the like. In such case, the anti-reflection layer RL may be formed in a pattern that is different from that of the fourth conductive layer 160 when viewed from the top. Such technique is well known in the art, and thus will not be described herein.

As the connection electrode 162T located across the non-display area NDA and the transmissive display area DPA_T is formed during the process of forming the fourth conductive layer 160, no additional process for forming the connection electrode 162T is required, the connection electrode 162T electrically connecting the transistor TR of the transistor area TRAT located in the non-display area NDA with the organic light-emitting diode OLED of the emission area EMAT located in the transmissive display area DPA_T. Accordingly, the number of masks required for the process may be reduced, and the efficiency of the process may be improved.

Figure 12:
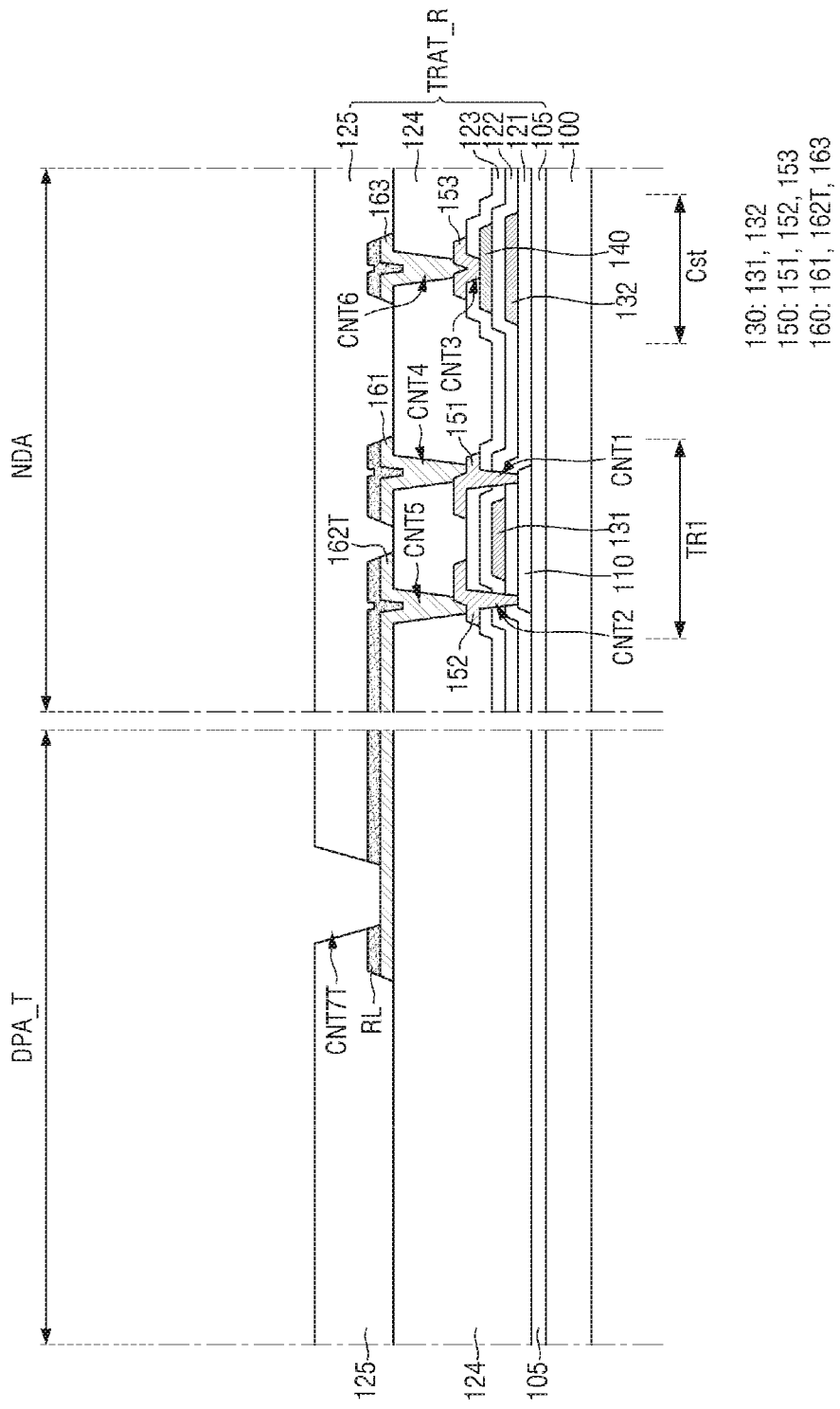

Subsequently, referring to FIG. 12, the fifth insulating layer 125 is formed over the fourth conductive layer 160 and the anti-reflection layer RL, and a contact hole CNT7T is formed.

For example, the fifth insulating layer 125 is formed over the fourth conductive layer 160 and the anti-reflection layer RL. The fifth insulating layer 125 may cover the fourth conductive layer 160 and the anti-reflection layer RL, and may be located throughout the substrate 100. Subsequently, a part of the fifth insulating layer 125 is etched via exposure and development, and the contact hole CNT7T is formed. In such case, the fifth insulating layer 125 as well as the anti-reflection layer RL may be etched together. Accordingly, the contact hole CNT7T may expose a part of the connection electrode 162T.

Figure 13:
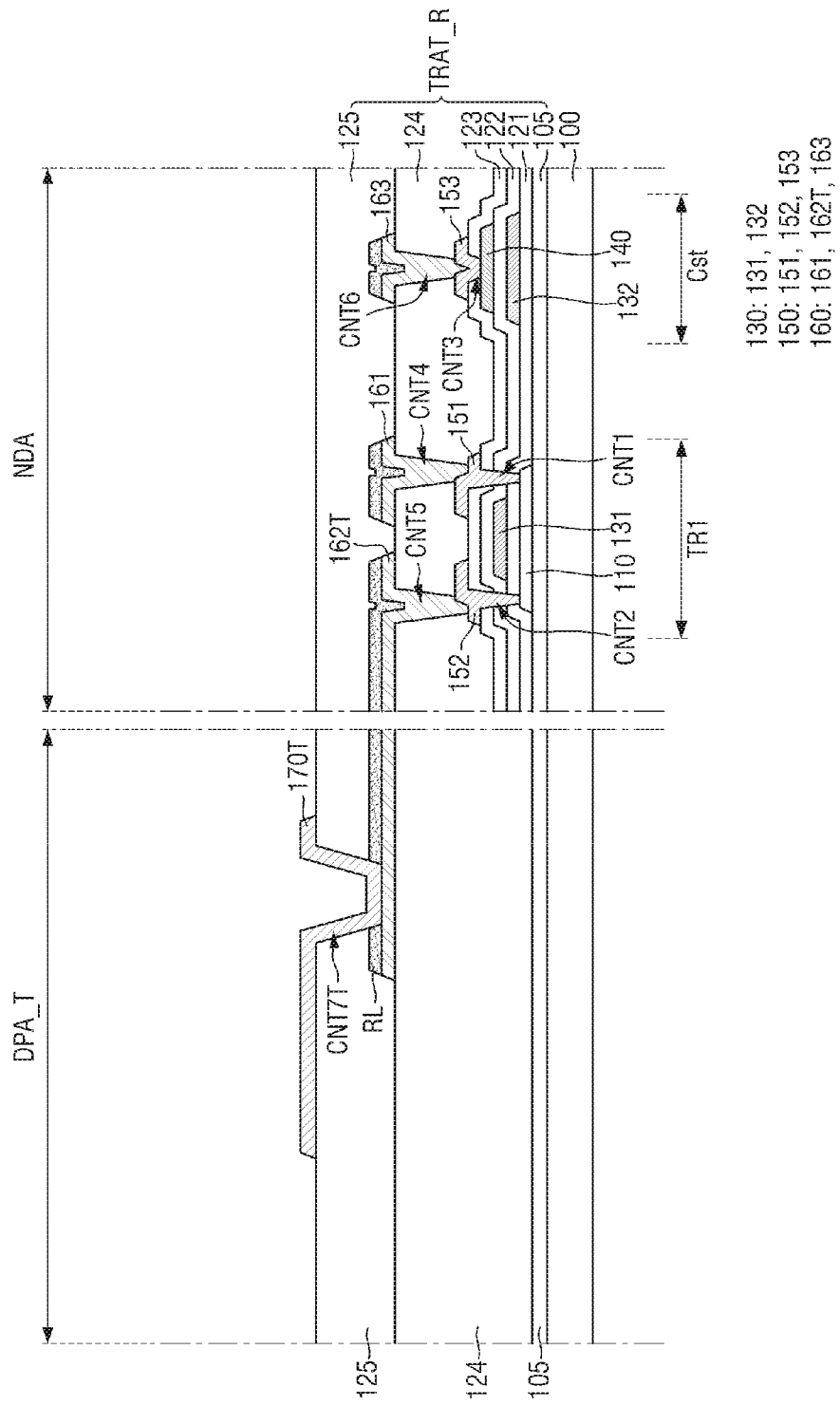

Subsequently, referring to FIG. 13, the fifth conductive layer 170 is formed on the fifth insulating layer 125. The patterned fifth conductive layer 170 may be formed via a mask process.

For example, a material layer for the fifth conductive layer is located entirely on the fifth insulating layer 125. During a deposition process, the contact hole CNT7T may be filled with the material layer for the fifth conductive layer, and the material layer for the fifth conductive layer deposited into the contact hole CNT7T may be physically and/or electrically connected to the connection electrode 162T. Subsequently, a photoresist layer is applied on the material layer for the fifth conductive layer, and a photoresist pattern is formed to expose a part of the material layer for the fifth conductive layer by exposure and development. Subsequently, the material layer for the fifth conductive layer is etched using the photoresist pattern to form the patterned fifth conductive layer 170 as shown in FIG. 13.

Figure 14:
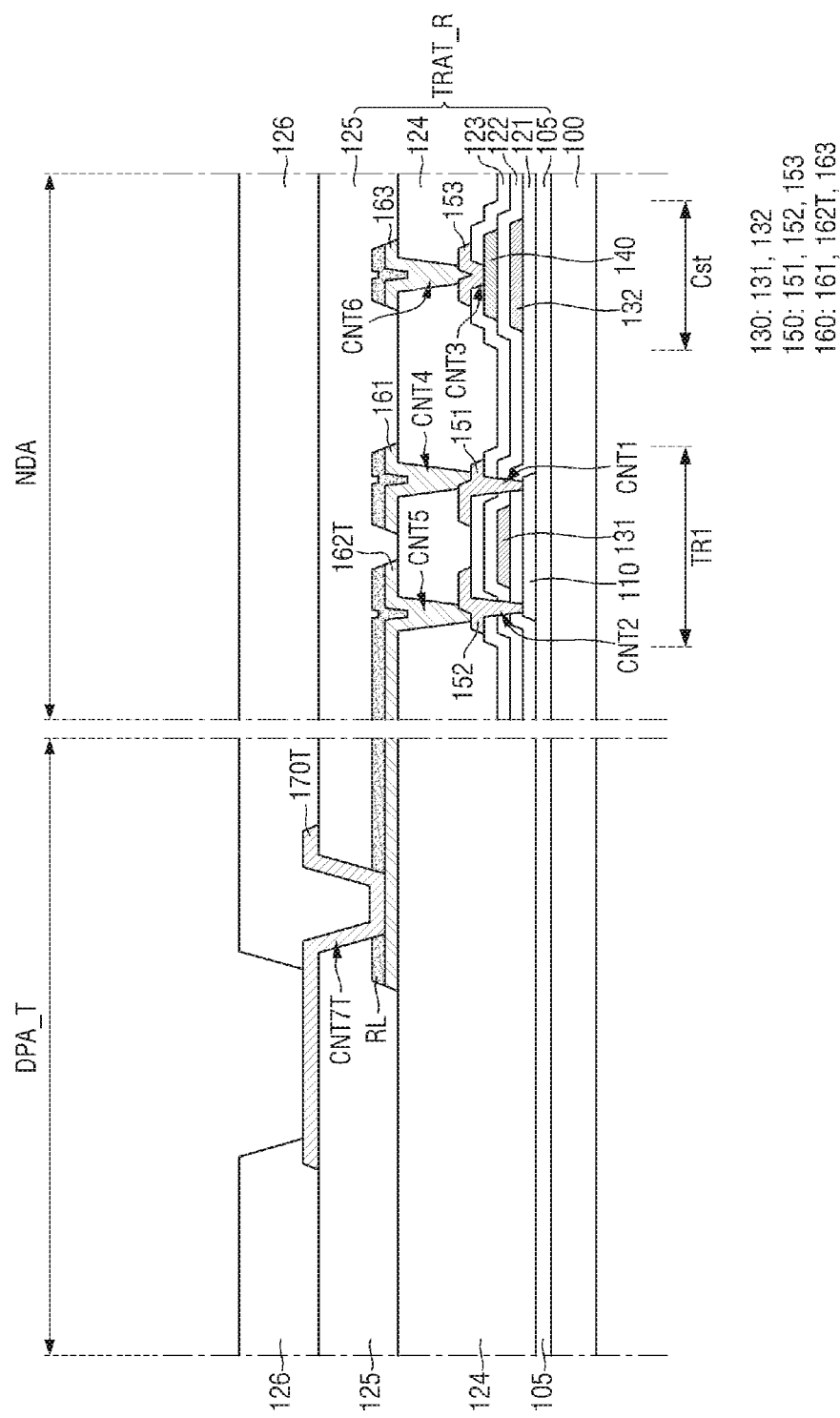

Subsequently, referring to FIG. 14, a bank 126 is formed on the fifth insulating layer 125 where the fifth conductive layer 170 is formed. The bank 126 may be made of, for example, an organic material including a photosensitive material. In such case, an organic material layer for the bank layer is applied and then patterned by exposure and development, to form the bank 126 as shown in FIG. 14.

The bank 126 may be formed along the boundary of the pixels PX, and may partially overlap the fifth conductive layer 170. The bank 126 may be formed to overlap the contact hole CNT7T. If the contact hole CNT7T is not completely filled with the fifth conductive layer 170, but instead partially filled with the fifth conductive layer 170, the contact hole CNT7T, or a remaining portion thereof, may be completely filled with the bank 126.

Hereinafter, other embodiments of the present disclosure will be described. In the following description, the same or similar elements will be denoted by the same or similar reference numerals, and redundant descriptions will be omitted or briefly described. Descriptions will be made focusing on differences from the above embodiments.

Figure 15:
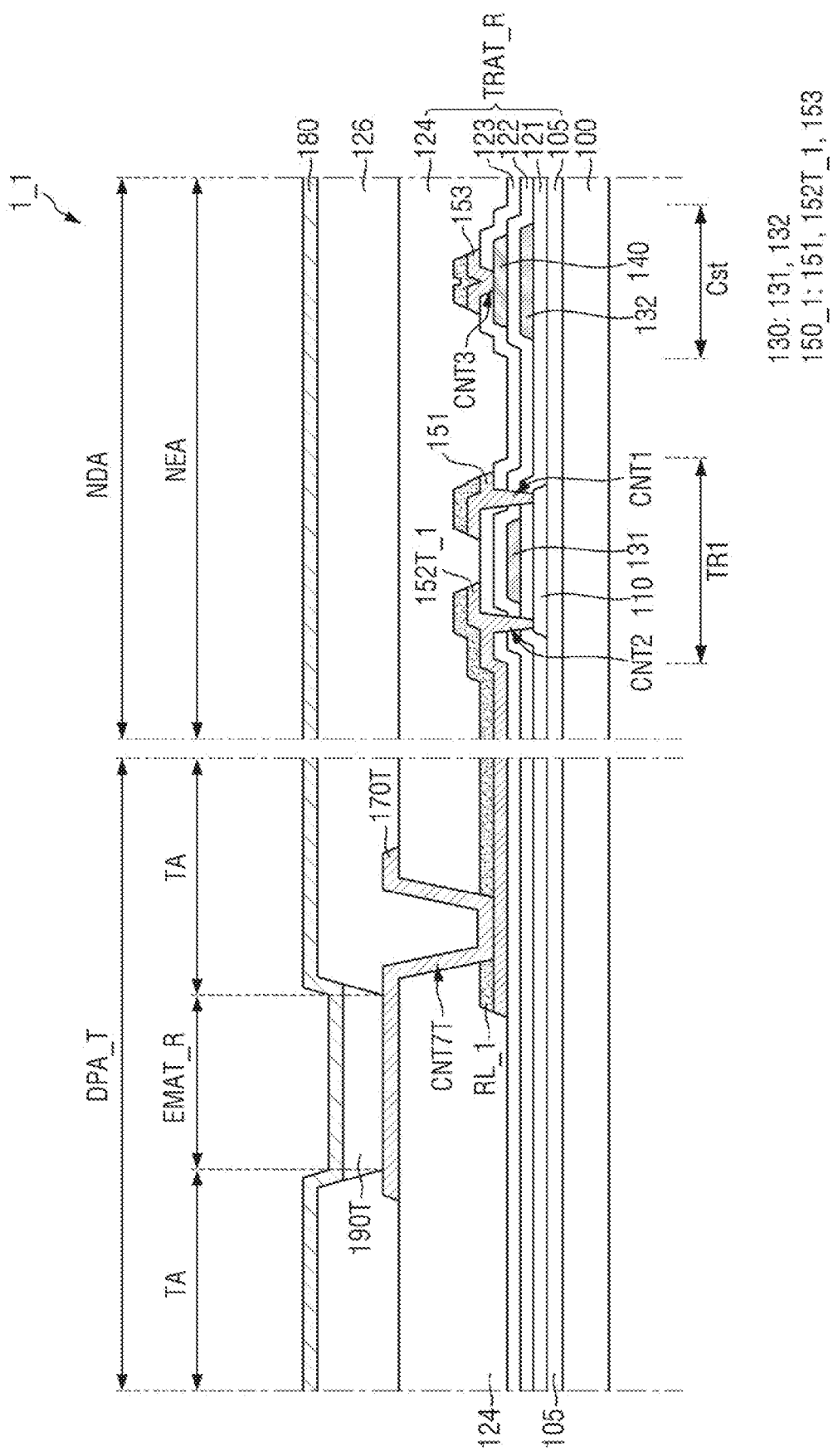
FIG. 15 is a cross-sectional view of a display device according to other embodiments of the present disclosure.

FIG. 15 is a cross-sectional view of a display device according to other embodiments of the present disclosure.

A display device 1_1 according to the embodiments of FIG. 15 is different from the display device of the embodiments of FIG. 6 in that the former does not include the fourth conductive layer 160, and in that the connection lines CL_R, CL_G, and CL_B of FIG. 3 are formed on the same layer as a first source/drain electrode and a second source/drain electrode of a first transistor TR1.

For example, a third conductive layer 150_1 according to some embodiments may include a first electrode 151 and a second electrode 152T_1 of a first transistor TR1 of a red pixel PXD_R, and a first supply voltage line 153. The second electrode 152T_1 of the first transistor TR1 of the red pixel PXD_R may be substantially identical to the connection lines CL_R, CL_G, and CL_B of FIG. 3, and the second electrode 152T_1 may be extended from the non-display area NDA to the transmissive display DPA_T. That is, the second electrode 152T_1 may be located across the non-display area NDA and the transmissive display area DPA_T.

Although the connection lines CL_R, CL_G, and CL_B of FIG. 3 are identical to the second electrode 152T_1 in the example shown in FIG. 15, the present disclosure is not limited thereto. They may be formed as a part of the second electrode 152T_1, and the remaining part of the second electrode 152T_1 may form the second electrode of the first transistor TR1. Accordingly, the connection lines CL_R, CL_G, and CL_B of FIG. 3 may be located on the same layer as the first source/drain electrode and the second source/drain electrode of the first transistor TR1.

An anti-reflection layer RL_1 may be located on a third conductive layer 150_1. The fifth conductive layer 170T may be physically and/or electrically connected to the second electrode 152T_1 of the first transistor TR1 of the red pixel PXD_R through a through hole CNT7T that penetrates the fourth insulating layer 124 and the anti-reflection layer RL_1 to expose the second electrode 152T_1.

Even in this case, the second electrode 152T_1 cannot be seen from the outside by virtue of the anti-reflection layer RL_1. The transistor TR is not located in the transmissive display area DPA_T, so the transmittance of the transmissive display area DPA_T may be improved. Moreover, by eliminating the fourth conductive layer 160 (see FIG. 6), the efficiency of the process may be improved and the process cost may be reduced.

Figure 16:
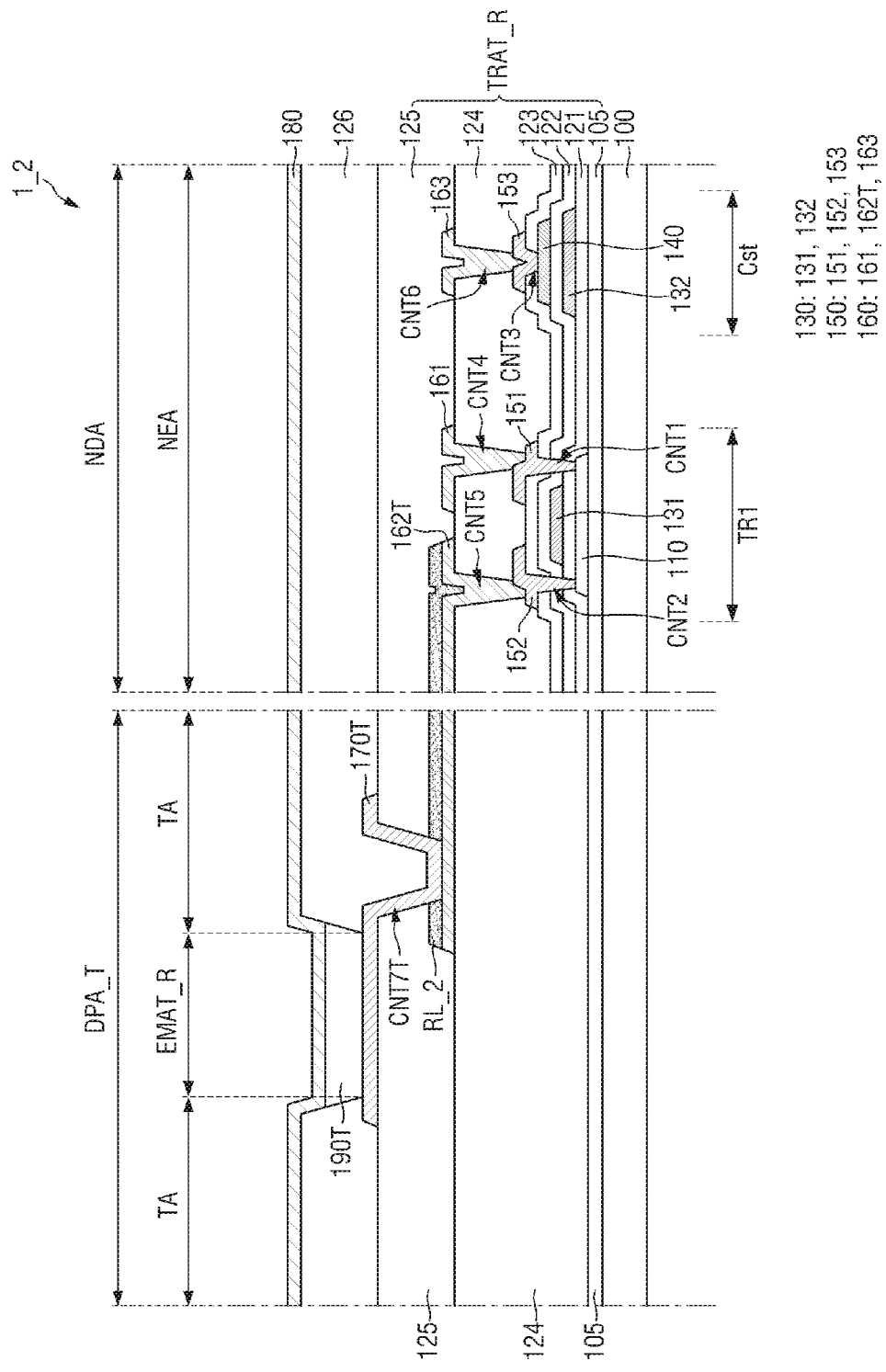
FIG. 16 is a cross-sectional view of a display device according to yet other embodiments of the present disclosure.

FIG. 16 is a cross-sectional view of a display device according to yet other embodiments of the present disclosure.

A display device 1_2 according to the embodiments of FIG. 16 is different from the display device according to the embodiments of FIG. 6 in that an anti-reflection layer RL_2 is formed in a pattern that is different from that of the fourth conductive layer 160 when viewed from the top.

For example, the anti-reflection layer RL_2 of the display device 1_2 may be located on a part of the fourth conductive layer 160. In other words, the anti-reflection layer RL_2 may overlap a part of the fourth conductive layer 160 to cover it while exposing the other part. For example, the anti-reflection layer RL_2 may be located on the connection electrode 162T, may overlap the connection electrode 162T, and may cover the connection electrode 162T. In this instance, the anti-reflection layer RL_2 might not be located on the first supply voltage lines 161 and 163, and thus the first supply voltage lines 161 and 163 may be exposed.

Even in this case, the connection electrode 162T cannot be seen from the outside by virtue of the anti-reflection layer RL_2. The transistor TR is not located in the transmissive display area DPA_T, so the transmittance of the transmissive display area DPA_T may be improved. In addition, by partially eliminating the anti-reflection layer RL_2, processing cost may be saved.

Figure 17:
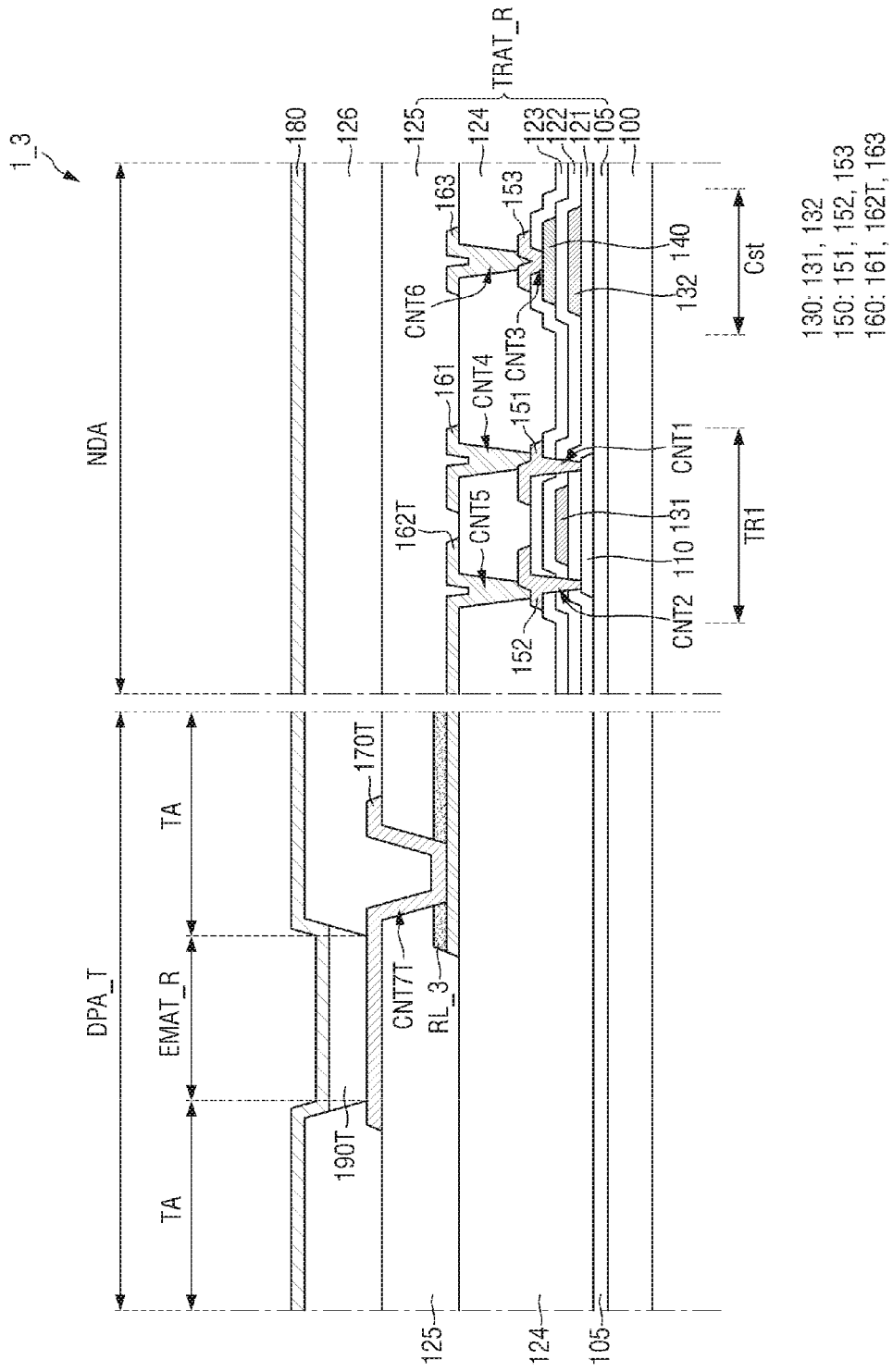
FIG. 17 is a cross-sectional view of a display device according to yet other embodiments of the present disclosure.

FIG. 17 is a cross-sectional view of a display device according to yet other embodiments of the present disclosure.

A display device 1_3 according to the embodiments of FIG. 17 is different from the display device of the embodiments of FIG. 16 in that an anti-reflection layer RL_3 is located only in the transmissive display area DPA_T.

For example, the anti-reflection layer RL_3 may cover a part of the connection electrode 162T. For example, the anti-reflection layer RL_3 may be located only in the transmissive display area DPA_T while being omitted from the non-display area NDA. Accordingly, the anti-reflection layer RL_3 may be located only on a part of the connection electrode 162T that is located in the transmissive display area DPA_T to cover the part only.

Even in this case, the connection electrode 162T cannot be seen from the outside by virtue of the anti-reflection layer RL_3. The transistor TR is not located in the transmissive display area DPA_T, so the transmittance of the transmissive display area DPA_T may be improved. In addition, by partially eliminating the anti-reflection layer RL_3, the processing cost may be saved.

Figure 18:
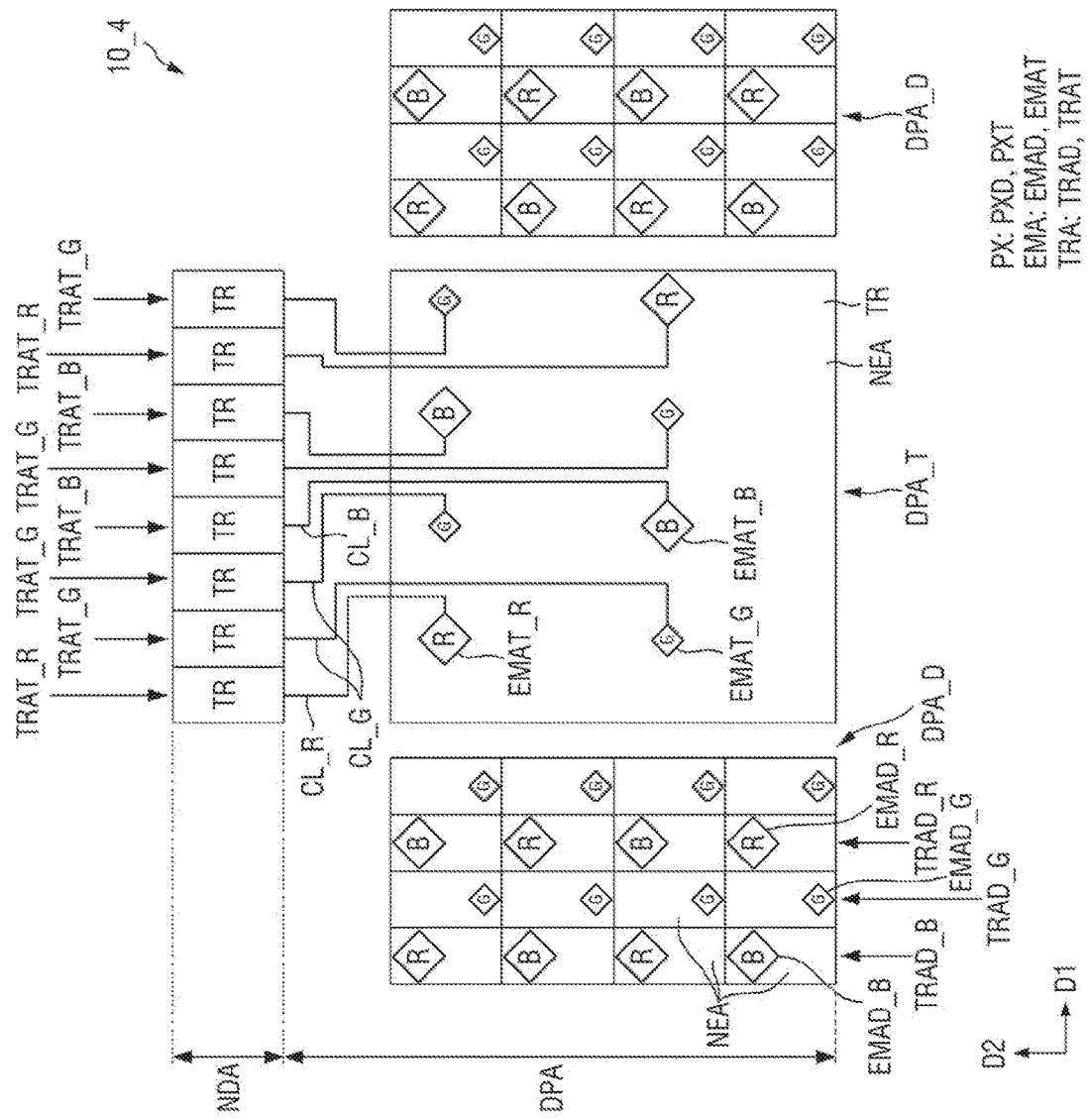
FIG. 18 is a diagram showing pixels arranged in different areas of the display panel, layouts of transistor areas and emission areas of the pixels, and transmitting areas according to yet other embodiments.

FIG. 18 is a diagram showing pixels arranged in different areas of the display panel, layouts of transistor areas and emission areas of the pixels, and transmitting areas according to yet other embodiments.

A display panel 10_4 according to the embodiments of FIG. 18 is different from that of the embodiments of FIG. 3 in that transistor areas TRAT of a transmissive display area pixels PXT are located on one side of the transmissive display area DPA_T in the second direction DR2.

For example, the transistor areas TRAT corresponding to the transmissive display area pixels PXT of the display panel 10_4 according to some embodiments may be located in the non-display area NDA on one side of the transmissive display area DPA_T in the second direction D2. When the transmissive display area DPA_T has a rectangular shape when viewed from the top, the transistor areas TRAT may be located adjacent to one side of the transmissive display area DPA_T with respect to the second direction DR2, and may be arranged repeatedly in the first direction D1. Emission areas EMAT of the transmissive display area pixels PXT may be located in the transmissive display area DPA_T. The transistors TR of the transistor areas TRAT located on the non-display area NDA may be electrically connected to organic light-emitting diodes OLED located in the emission areas EMAT by connection lines CL_R, CL_G, and CL_B.

Even in this case, the connection electrode 162T cannot be seen from the outside by virtue of the anti-reflection layer RL. The transistor TR is not located in the transmissive display area DPA_T, so the transmittance of the transmissive display area DPA_T may be improved. In addition, as the transistor areas TRAT of the transmissive display area pixels PXT are located on one side of the transmissive display area DPA_T in the second direction D2, it is easier to arrange the connection lines CL_R, CL_G, and CL_B.

Figure 19:
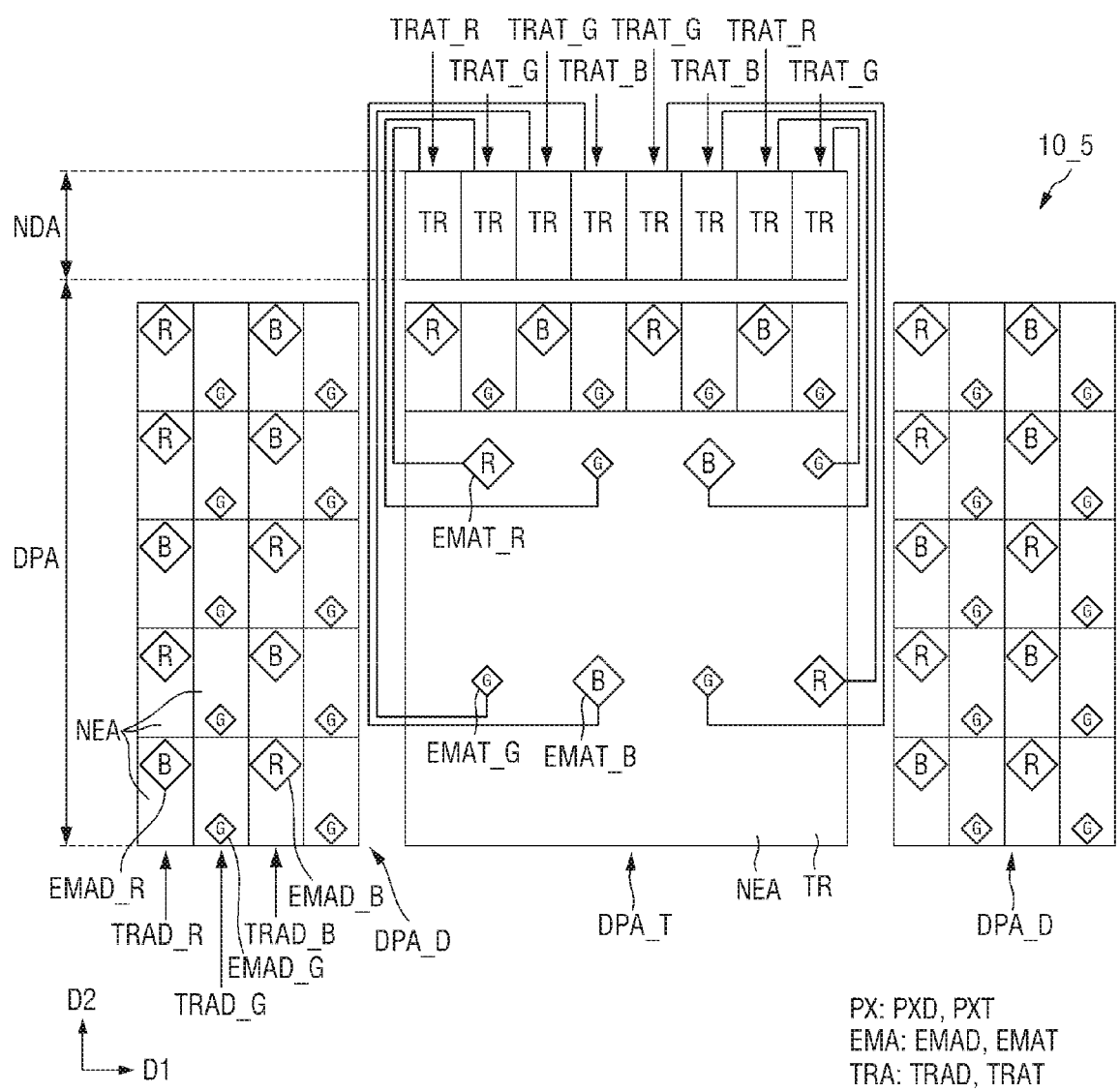
FIG. 19 is a diagram showing pixels arranged in different areas of the display panel, layouts of transistor areas and emission areas of the pixels, and transmitting areas according to yet other embodiments.

FIG. 19 is a diagram showing pixels arranged in different areas of the display panel, layouts of transistor areas and emission areas of the pixels, and transmitting areas according to yet other embodiments.

A display panel 10_5 according to the embodiments of FIG. 19 is different from that of the embodiments of FIG. 18 in that display-only area pixels PXD are located between transistor areas TRAT of transmissive display area pixels PXT and a transmissive display area DPA_T.

For example, the transistor areas TRAT of the transmissive display area pixels PXT may be spaced apart from the transmissive display area DPA_T in the second direction D2, and the display-only area pixels PXD may be located therebetween. In this instance, the transmissive display area DPA_T may be surrounded by the display-only area DPA_D when viewed from the top.

The arrangement of the connection lines CL_R, CL_G, and CL_B shown in FIG. 19 are merely illustrative, and the present disclosure is not limited thereto. In other words, the arrangement of the connection lines CL_R, CL_G, and CL_B is not limited to that shown in FIG. 19, but may be altered in a variety of ways. For example, the connection lines CL_R, CL_G, and CL_B may traverse the transistor area TRA.

Even in this case, the connection electrode 162T cannot be seen from the outside by virtue of the anti-reflection layer RL. The transistor TR is not located in the transmissive display area DPA_T, so the transmittance of the transmissive display area DPA_T may be improved. In addition, as the transistor areas TRAT of the transmissive display area pixels PXT are located on one side of the transmissive display area DPA_T in the second direction D2, it is easier to locate the connection lines CL_R, CL_G, and CL_B.

Figure 20:
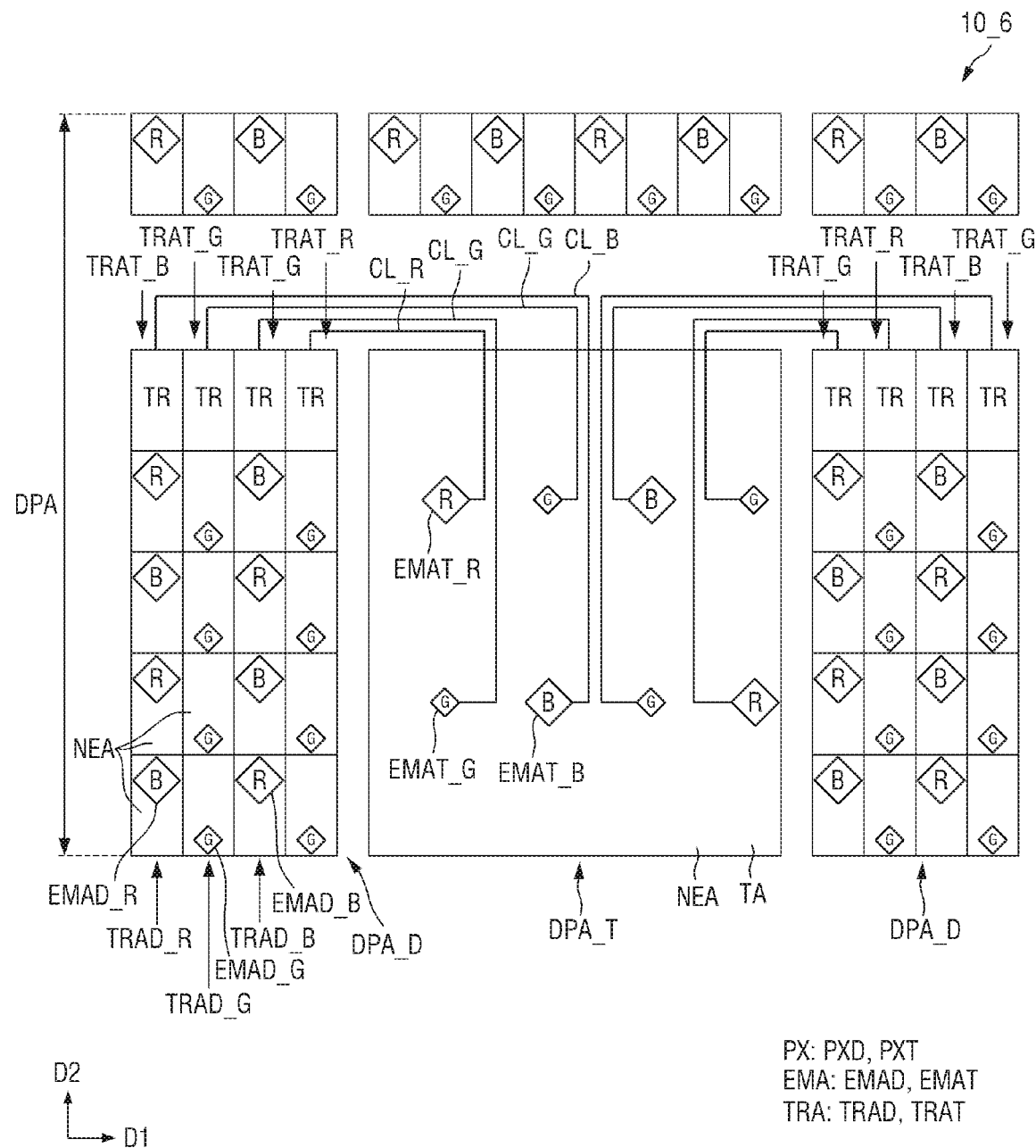
FIG. 20 is a diagram showing pixels arranged in different areas of the display panel, layouts of transistor areas and emission areas of the pixels, and transmitting areas according to yet other embodiments.

FIG. 20 is a diagram showing pixels arranged in different areas of the display panel, layouts of transistor areas and emission areas of the pixels, and transmitting areas according to yet other embodiments.

A display panel 10_6 according to the embodiments of FIG. 20 is different from that of the embodiments of FIG. 3 in that transistor areas TRAT of transmissive display area pixels PXT are located in a display area DPA.

For example, the transistor areas TRAT of the transmissive display area pixels PXT may be located in the display area DPA, and the display-only area pixels PXD may be located on one side and the other side of the display area DPA, and on one side of the transistor areas TRAT with respect to the second direction D2. In this instance, the display-only area pixels PXD may be located on respective sides of the transmissive display area DPA_T with respect to the first direction D1, and offset in the second direction D2.

Transistor areas TRAD of the display-only area pixels PXD located on one side of the transmissive display area DPA_T with respect to the first direction D1 may be spaced apart from the transmissive display area DPA_T. It is, however, to be understood that the present disclosure is not limited thereto. For example, the transistor areas TRAD of the display-only area pixels PXD may be located adjacent to the transmissive display area DPA_T.

In addition, the arrangement of the connection lines CL_R, CL_G, and CL_B shown in FIG. 20 are merely illustrative, and the present disclosure is not limited thereto. In other words, the arrangement of the connection lines CL_R, CL_G, and CL_B is not limited to that shown in FIG. 20, but may be altered in a variety of ways. For example, the connection lines CL_R, CL_G, and CL_B may traverse the transistor areas TRA.

Even in this case, the connection electrode 162T cannot be seen from the outside by virtue of the anti-reflection layer RL. The transistor TR is not located in the transmissive display area DPA_T, so the transmittance of the transmissive display area DPA_T may be improved. In addition, the transistor areas TRAT of the transmissive display area pixels PXT are located in the display area DPA, allowing more design freedom for the display area DPA of the display panel 10_6.

In concluding the detailed description, those skilled in the art will appreciate that many variations and modifications may be made to the preferred embodiments without substantially departing from the principles of the present disclosure. Therefore, the disclosed embodiments of the present disclosure are used in a generic and descriptive sense only and not for purposes of limitation, noting that the functional equivalents of the claims are intended to be included therein.

What is claimed is:

1. A display device comprising a non-display area where no image is displayed, and a display area where images are displayed and comprising a transmitting area, the display device comprising:
   a pixel comprising:
      a transistor in the non-display area; and
      an anode electrode in the display area,
   wherein the transistor and the anode electrode are electrically connected by a connection line having a same stack structure as a first conductive layer comprising a source electrode and a drain electrode of the transistor, and
   wherein at least a part of the connection line is in the display area and is covered by an anti-reflection layer.

2. The display device of claim 1, further comprising an insulating layer between the anode electrode and the connection line,
   wherein the anode electrode and the connection line are electrically connected via a through hole penetrating the insulating layer and the anti-reflection layer.

3. The display device of claim 2, wherein the through hole is formed in the display area.

4. The display device of claim 1, wherein the connection line comprises an opaque metal, and wherein a width of the connection line is between about 1.2 μm to about 1.5 μm.

5. The display device of claim 4, wherein the anti-reflection layer has an electrical resistance that is greater than that of the connection line.

6. The display device of claim 5, wherein the anti-reflection layer comprises molybdenum (Mo), a molybdenum alloy, a molybdenum oxide (MoOx), or an oxide of a molybdenum alloy.

* * * * *